United States Patent
Sun et al.

(10) Patent No.: US 8,552,515 B2
(45) Date of Patent: Oct. 8, 2013

(54) METHOD FOR FABRICATING A DAMASCENE SELF-ALIGNED FERROELECTRIC RANDOM ACCESS MEMORY (F-RAM) DEVICE STRUCTURE EMPLOYING REDUCED PROCESSING STEPS

(75) Inventors: Shan Sun, Monument, CO (US); Thomas E. Davenport, Denver, CO (US); John Cronin, Jericho, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/569,735

(22) Filed: Aug. 8, 2012

(65) Prior Publication Data

US 2013/0037897 A1     Feb. 14, 2013

Related U.S. Application Data

(60) Provisional application No. 61/522,953, filed on Aug. 12, 2011.

(51) Int. Cl.
    *H01L 21/02*     (2006.01)

(52) U.S. Cl.
    USPC ............... 257/421; 438/3; 438/239; 438/240; 438/243; 438/386

(58) Field of Classification Search
    USPC ....................... 438/3, 239, 240, 243, 386, 396
    See application file for complete search history.

(56) References Cited

U.S. PATENT DOCUMENTS

| | | |
|---|---|---|
| 4,888,733 A | 12/1989 | Mobley |
| 4,914,627 A | 4/1990 | Eaton, Jr. et al. |
| 5,394,367 A | 2/1995 | Downs et al. |
| 5,638,319 A * | 6/1997 | Onishi et al. .................. 365/145 |
| 5,864,932 A | 2/1999 | Evans et al. |
| 5,920,453 A | 7/1999 | Evans et al. |
| 5,990,513 A | 11/1999 | Perino et al. |
| 6,027,947 A | 2/2000 | Evans et al. |
| 6,150,184 A | 11/2000 | Evans et al. |
| 6,153,460 A * | 11/2000 | Ohnishi et al. ................ 438/238 |
| 6,174,735 B1 | 1/2001 | Evans |
| 6,190,926 B1 | 2/2001 | Perino et al. |
| 6,201,726 B1 | 3/2001 | Evans |
| 6,211,542 B1 | 4/2001 | Eastep et al. |
| 6,242,299 B1 | 6/2001 | Hickert |
| 6,249,014 B1 | 6/2001 | Bailey |
| 6,281,023 B2 | 8/2001 | Eastep et al. |
| 6,358,755 B1 | 3/2002 | Evans |
| 6,376,259 B1 | 4/2002 | Chu et al. |
| 6,423,592 B1 | 7/2002 | Sun |
| 6,492,673 B1 | 12/2002 | Fox et al. |
| 6,495,413 B2 | 12/2002 | Sun et al. |
| 6,597,028 B2 | 7/2003 | Fox et al. |
| 6,613,586 B2 * | 9/2003 | Bailey ............................... 438/3 |

* cited by examiner

*Primary Examiner* — Chuong A Luu
*Assistant Examiner* — Rodolfo Fortich

(57) ABSTRACT

Disclosed is a novel non-volatile, ferroelectric random access memory (F-RAM) device and a method for fabricating a damascene self-aligned F-RAM device structure on a planar surface using a reduced number of masks and etching steps.

71 Claims, 31 Drawing Sheets

METHOD FOR FABRICATING A DAMASCENE SELF-ALIGNED FERROELECTRIC RANDOM ACCESS MEMORY (F-RAM) DEVICE STRUCTURE EMPLOYING REDUCED PROCESSING STEPS

CROSS REFERENCE TO RELATED PATENT APPLICATIONS

The present application claims priority from U.S. Provisional Patent Application Ser. No. 61/522,953 filed Aug. 12, 2011, the disclosure of which is herein specifically incorporated by this reference in its entirety. The present invention is also related to the subject matter disclosed in U.S. patent application Ser. No. 13/569,755, filed Aug. 8, 2012, now U.S. Pat. No. 8,518,791, issued Aug. 27, 2013, for "Method for Fabricating a Damascene Self-Aligned Ferroelectric Random Access Memory (F-RAM) with Simultaneous Formation of Sidewall Ferroelectric Capacitors" and U.S. patent application Ser. No. 13/569,785, filed Aug. 8, 2012, now U.S. Pat. No. 8,518,792, issued Aug. 27, 2013, for "Method for Fabricating a Damascene Self-Aligned Ferroelectric Random Access Memory (F-RAM) Having a Ferroelectric Capacitor Aligned with a Three Dimensional Transistor Structure", the disclosures of which are also herein specifically incorporated by this reference in their entirety.

BACKGROUND OF THE INVENTION

The present invention relates, in general, to the field of integrated circuit (IC) memory devices. More particularly, the present invention relates to the field of non-volatile, ferroelectric random access memory (F-RAM) devices and a method for fabricating a damascene self-aligned F-RAM device structure on a planar surface using a reduced number of masks and etching steps.

According to World Semiconductor Trade Statistics (WSTS), the semiconductor market reached an important milestone in 2010, posting worldwide revenues of more than $300 billion (in United States dollars) for the first time in the industry's history. In particular, the memory chip segment exhibited the highest growth rate during 2010, increasing from $45 billion in 2009 to $71 billion in 2010, representing a 57% year-over-year growth rate. Embedded memory devices represented more than 23% of the overall semiconductor market in 2010.

Within this context, the increasing demand for higher processing power is driving the semiconductor industry to develop memory devices with higher operational speeds in order to support the capabilities of modern electronic devices. F-RAM has emerged as a promising option for the industry, particularly in the market areas of mobile computing, smart meters, radio frequency identification (RFID) devices, office equipment and other applications requiring non-volatile data storage.

Standard dynamic random access memory (DRAM) and static random access memory (SRAM) devices, while providing relatively fast access times, are considered to be volatile memory devices inasmuch as data stored in such memories is lost when power is interrupted. In contrast, non-volatile memory devices are those that function to retain data despite any loss of power.

F-RAM devices are inherently non-volatile, meaning that these memory devices are able to retain stored data while the device is not powered. In comparison to electrically erasable programmable read only memory (EEPROM) FLASH memory devices, which are currently the most popular type of non-volatile memory, F-RAM devices have several advantages including lower power requirements (operational voltages of just 5V needed during read-write operations), higher read-write speeds (less than 70 nanoseconds), and virtually unlimited write endurance capability (more than 10,000,000,000 write cycles).

F-RAM memory devices may be fabricated based on the use of lead zirconium titanate (PZT) ferroelectric storage capacitors as memory elements integrated with complementary metal oxide semiconductor (CMOS) addressing, selection, and control logic. PLZT is a lanthanum-doped form of PZT wherein some of the lead is replaced with Lanthanum.

It is also known that PZT may also be doped with strontium and calcium to improve its ferroelectric dielectric properties. Ferroelectric storage capacitors having a strontium bismuth tantalate (SBT); barium strontium titanate (BST); and strontium titanate oxide (STO) dielectrics are also known in the art.

As used in the present application, the term "PZT" shall also be considered to include PLZT, SBT, BST, STO and other comparable ferroelectric dielectric materials. Further, it should be noted that the techniques of the present invention disclosed herein are applicable to all known ferroelectric dielectrics including Perovskites and layered Perovskites (whether doped or undoped) including PZT, PLZT, BST, SBT, STO and others while simultaneously allowing for a potentially broader choice of electrode materials and the use of a forming gas anneal process step on the completed IC structure.

Regardless of the ferroelectric dielectric material employed, in operation F-RAM devices function through their ability to be polarized in one direction or another in order to store a binary value representative of a logic level "one" or "zero". The ferroelectric effect allows for the retention of a stable polarization state in the absence of an applied electric field due to the alignment of internal dipoles within the Perovskite crystals in the dielectric material. This alignment may be selectively achieved by application of an electric field which exceeds the coercive field of the material. Conversely, reversal of the applied field reverses the internal dipoles.

A hysteresis curve, wherein the abscissa and ordinate represent the applied voltage ("V") and resulting polarization ("Q") states respectively, may be plotted to represent the response of the polarization of a ferroelectric capacitor to the applied voltage. A more complete description of this characteristic hysteresis curve is disclosed, for example, in U.S. Pat. Nos. 4,914,627 and 4,888,733 assigned to Ramtron International Corporation, assignee of the present invention, the disclosures of which are herein specifically incorporated by this reference.

Representative of the current state of the art in F-RAM device fabrication is that disclosed in U.S. Pat. No. 6,150,184 for: "Method of Fabricating Partially or Completely Encapsulated Top Electrode of a Ferroelectric Capacitor," also assigned to Ramtron International Corporation. Therein described is the structure of a ferroelectric capacitor that includes a bottom electrode, a top electrode, and a ferroelectric layer located between the top and bottom electrodes that extends to completely encapsulate the top electrode, except for a contact hole to allow metallization of the top electrode. The total encapsulation of the top electrode reduces the sensitivity of the ferroelectric capacitor to hydrogen and thus improves electrical switching performance. The encapsulation technique can also be used to improve the performance of ferroelectric integrated circuits and other devices.

Further representative of the state of the art in the fabrication of F-RAM devices is that disclosed in U.S. Pat. No.

6,613,586 for: "Hydrogen Barrier Encapsulation Techniques for the Control of Hydrogen Induced Degradation of Ferroelectric Capacitors in Conjunction with Multilevel Metal Processing for Non-Volatile Integrated Circuit Memory Devices," also assigned to Ramtron International Corporation. Therein described is a device structure which ameliorates the hydrogen induced degradation of ferroelectric capacitors by completely encapsulating the capacitor within a suitable hydrogen barrier material, such as chemical vapor deposition ("CVD") or sputtered silicon nitride ($Si_3N_4$), thus ensuring process compatibility with industry standard process steps. Although the deposition process for CVD $Si_3N_4$ itself contains hydrogen, the deposition time may be kept relatively short thereby allowing the titanium nitride (TiN) local interconnect layer to act as a "short term" hydrogen barrier.

The disclosures of U.S. Pat. Nos. 6,150,184 and 6,613,586 are herein specifically incorporated by this reference in their entirety.

Despite the aforementioned advantages over volatile memory devices and other non-volatile technologies, F-RAMs currently account for a relatively small share of the non-volatile memory device market. Competitively, the main limitation of the F-RAM technology has been its lower storage density compared to FLASH devices coupled with higher manufacturing costs. These limitations stem primarily from the generally complex structure of current F-RAM devices which results in a manufacturing process that requires a high number of processing masks and etching steps. As such, in order to be more competitive in the current memory device marketplace and be usable in a wider range of modern electronic devices, F-RAM devices need to be more highly integrated, implying increased storage densities and reduced manufacturing costs.

As such, it would be highly advantageous to reduce the number of layers and etching steps required during F-RAM fabrication in order to reduce manufacturing costs. Still further, it would be highly advantageous to simplify the structure of F-RAM devices with the purpose of improving storage density capabilities.

SUMMARY OF THE INVENTION

Disclosed herein is a method for forming a damascene self-aligned ferroelectric RAM (F-RAM) device on a planar surface comprising the steps of forming, on a planar surface of a semiconductor substrate, a thick oxide layer which is etched based on the pattern established by a non-erodible mask, forming an opening for the F-RAM construction, followed by the application and etching of a CVD aluminum oxide conformal layer to form spacers, deposition of a titanium aluminum nitride layer, followed by the application and $O_2$ plasma ash etching of a photoresist material, deposition and planarization of an oxide material using chemical mechanical polishing (CMP), application of a photoresist mask to create an etching pattern on the oxide, deposition of a CVD aluminum oxide conformal layer to form a second set of spacers after the oxide is etched, deposition, planarization and etching of a ferroelectric layer ideally doped with lead zirconium titanate (PZT), followed by a similar process on top electrode and nitride layers, and the etching of the oxide and nitride layers for the formation of CVD tungsten, titanium/titanium nitride studs on a planar surface of the F-RAM structure.

Also further disclosed herein is a method for forming an integrated circuit device on a substrate comprising forming a first insulating layer on the substrate and removing a portion of the first insulating layer to produce an opening to an exposed surface of the substrate therein. First spacers are formed on sidewalls of the opening and a first conductive layer is formed on the exposed surface of the substrate separated from the first spacers on the sidewalls of the opening by a gap therebetween. A bottom electrode of a ferroelectric capacitor is formed over the first conductive layer and in the gap laterally of the first conductive layer. A second insulating layer is formed adjoining the spacers in the opening and second spacers are formed on the second insulating layer in the opening. A ferroelectric dielectric layer is formed on the bottom electrode between the second spacers and a top electrode is formed on the ferroelectric dielectric. A bottom electrode contact opening is formed through a portion of the second insulating layer to the bottom electrode and a first electrical contact is formed to the top electrode and a second electrical contact is formed to the bottom electrode through the bottom electrode contact opening.

Still further disclosed herein is a method for forming a ferroelectric device on a planar surface of a semiconductor substrate comprising forming a relatively thick oxide layer on the planar surface and selectively etching an opening through the oxide layer in a pattern established by a non-erodible mask. A first aluminum oxide conformal layer is applied and selectively etched to form first spacers on sidewalls of the opening and a titanium aluminum nitride layer is deposited in a lower portion of the opening and separated from the first spacers. A bottom electrode of a ferroelectric capacitor is formed over the aluminum oxide layer in contact with the spacers and laterally of the aluminum oxide layer. An oxide material is deposited, planarized and selectively removed to form an additional oxide layer adjoining the first spacers in the opening. A second aluminum oxide layer is deposited and selectively etched to form second spacers on the additional oxide layer. A ferroelectric layer is deposited and etched on the bottom electrode between the second spacers. A top electrode is formed on the ferroelectric layer and a Ti/TiN and W contact is formed to the bottom electrode through the oxide material and a Ti/TiN and W contact is also substantially concurrently formed to the top electrode.

Additionally disclosed herein is a ferroelectric device which comprises a contact stud formed upon a semiconductor substrate and a first conductive layer overlying the substrate and adjoining the contact stud. A bottom electrode layer overlies the first conductive layer and first spacers are disposed laterally of the bottom electrode layer extending distally of the substrate. Second spacers are disposed on the bottom electrode layer extending distally therefrom substantially parallel to the first spacers and an insulating layer is disposed between the first and second spacers. A ferroelectric dielectric layer overlies the bottom electrode layer between the second spacers and a top electrode layer overlies the ferroelectric dielectric layer. A top electrode contact adjoins the top electrode layer and a bottom electrode contact adjoins the bottom electrode layer extending through the insulating layer.

Also further disclosed herein is a method for forming an integrated circuit device on a substrate including at least one contact stud. The method comprises forming a first insulating layer on the substrate and removing a portion of the first insulating layer to produce an opening to an exposed surface of said substrate therein. First spacers are formed on the sidewalls of the opening and a first conductive layer is formed in contact with the contact stud on the exposed surface of the substrate separated from the first spacers on the sidewalls of the opening by a gap therebetween. A bottom electrode of a ferroelectric capacitor is formed over the first conductive layer and in the gap laterally of the first conductive layer. A second insulating layer is formed adjoining the spacers in the opening and second spacers are formed on the second insulating layer in the opening. A ferroelectric dielectric is formed on the bottom electrode between the second spacers and a top electrode is formed on the ferroelectric dielectric. An electrical contact is then formed to the top electrode.

Also further disclosed herein is a ferroelectric device which comprises a semiconductor substrate and a first conductive layer overlying the semiconductor substrate. A bottom electrode layer overlies the first conductive layer and first spacers are disposed laterally of the bottom electrode layer and extend distally of the substrate. Second spacers are disposed on the bottom electrode layer and extend distally therefrom substantially parallel to the first spacers. An insulating layer is disposed between the first and second spacers and a ferroelectric dielectric layer overlies the bottom electrode layer between the second spacers. A top electrode layer overlies the ferroelectric dielectric layer, a top electrode contact adjoins the top electrode layer and a bottom electrode contact adjoins the bottom electrode layer extending through the insulating layer.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

The present invention presents a novel, non-volatile, ferroelectric random access memory (F-RAM) device and a method for fabricating a damascene self-aligned F-RAM device structure on a planar surface using a reduced number of masks and etching steps.

A representative method in accordance with the present invention comprises the processing steps disclosed in FIGS. 1 through 31 inclusive.

Figure 1:
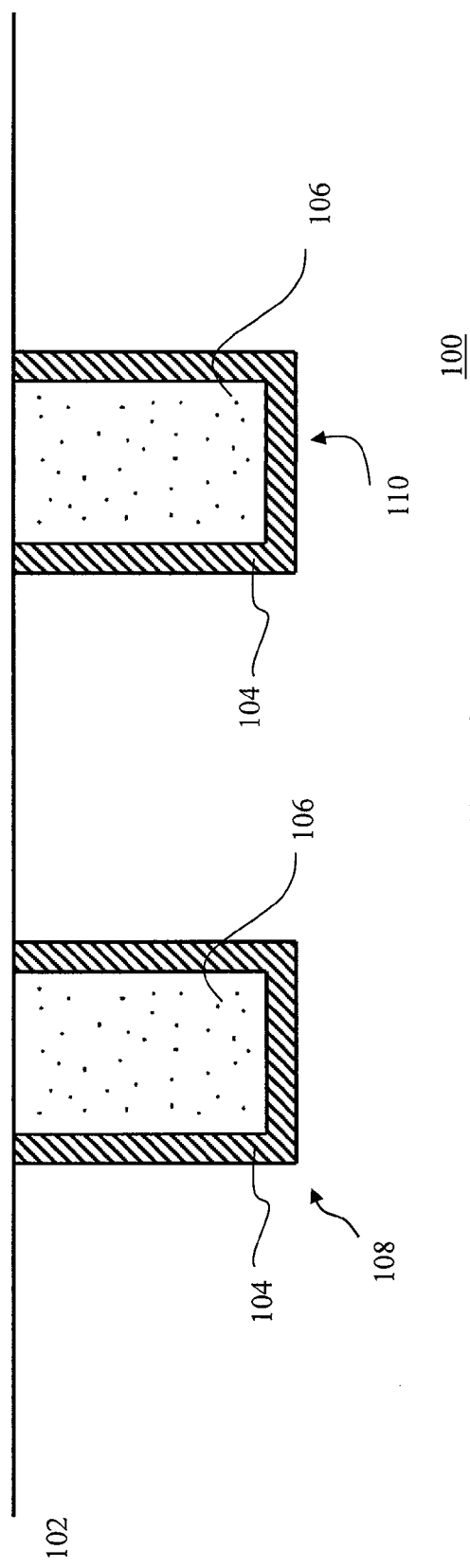
FIG. 1 illustrates a partial, cross-sectional view of the structure of an F-RAM substrate providing a depiction of the first-level F-RAM substrate with contact studs.

With reference now to FIG. 1, the structure of F-RAM substrate 100 is shown, and provides a depiction of the first-level F-RAM substrate with contact stud 108 and contact stud 110. In FIG. 1, a layer of BSPG 102 (boron phosphorus silicon glass) is deposited and planarized onto a silicon or other substrate (not shown in FIG. 1). Any oxide, nitride, or other appropriate dielectric can be substituted for the BPSG 102 layer. Formed in the BPSG 102 layer are contact stud 108 and contact stud 110 which are formed by Ti/TiN 104 (titanium/titanium nitride) liners and a chemical vapor deposition (CVD) of CVD tungsten (W) 106.

Figure 2:
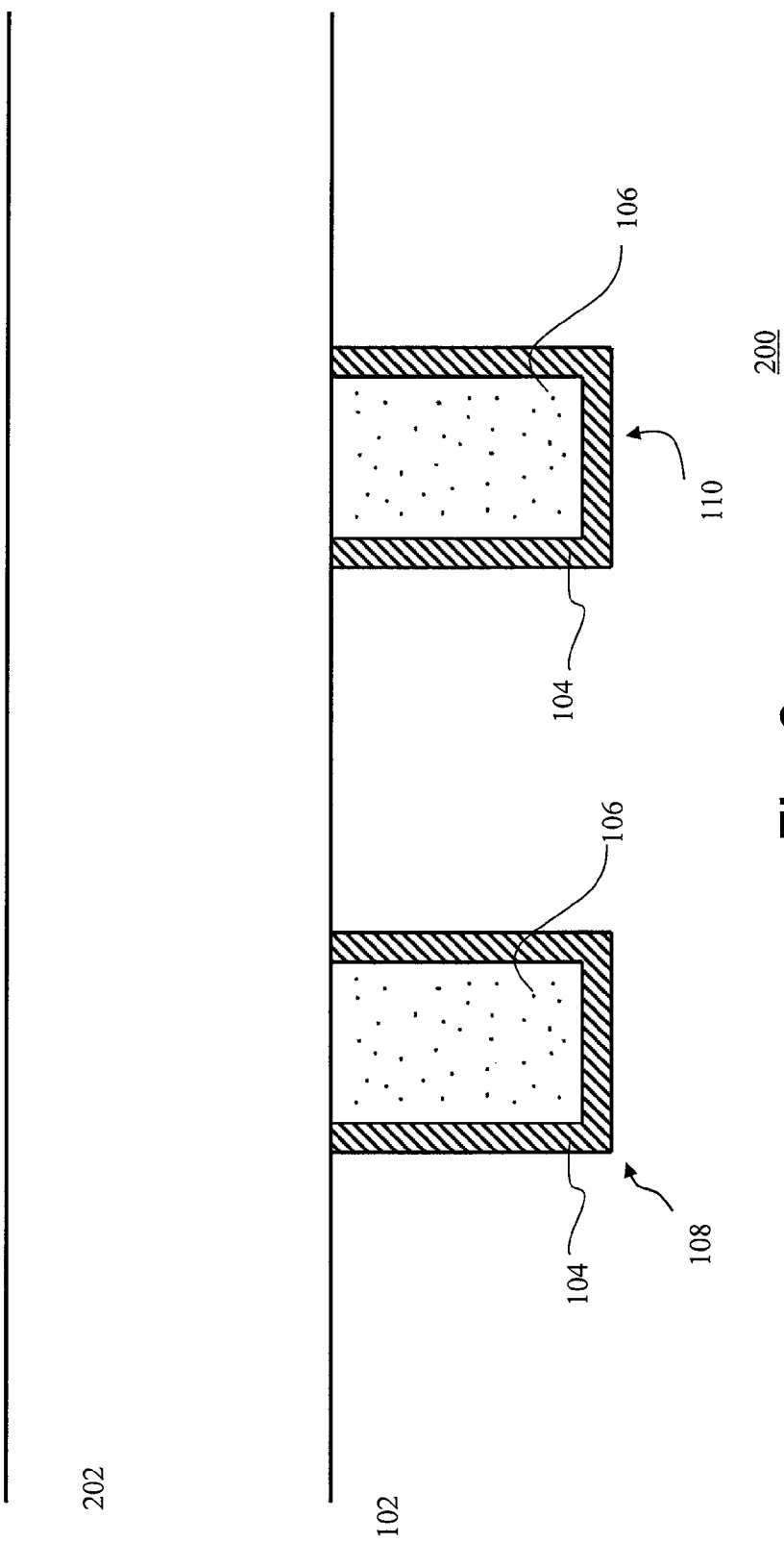
FIG. 2 is a follow-on view of the structure of the F-RAM substrate of the preceding figure after a thick oxide layer is deposited.

With reference additionally now to FIG. 2, the structure of F-RAM substrate 200 is illustrated depicting a thick oxide 202 layer of one to two microns thick, deposited over the F-RAM substrate 100. The thick oxide 202 layer is planar as it is deposited over the planarized surface, BPSG 102.

Figure 3:
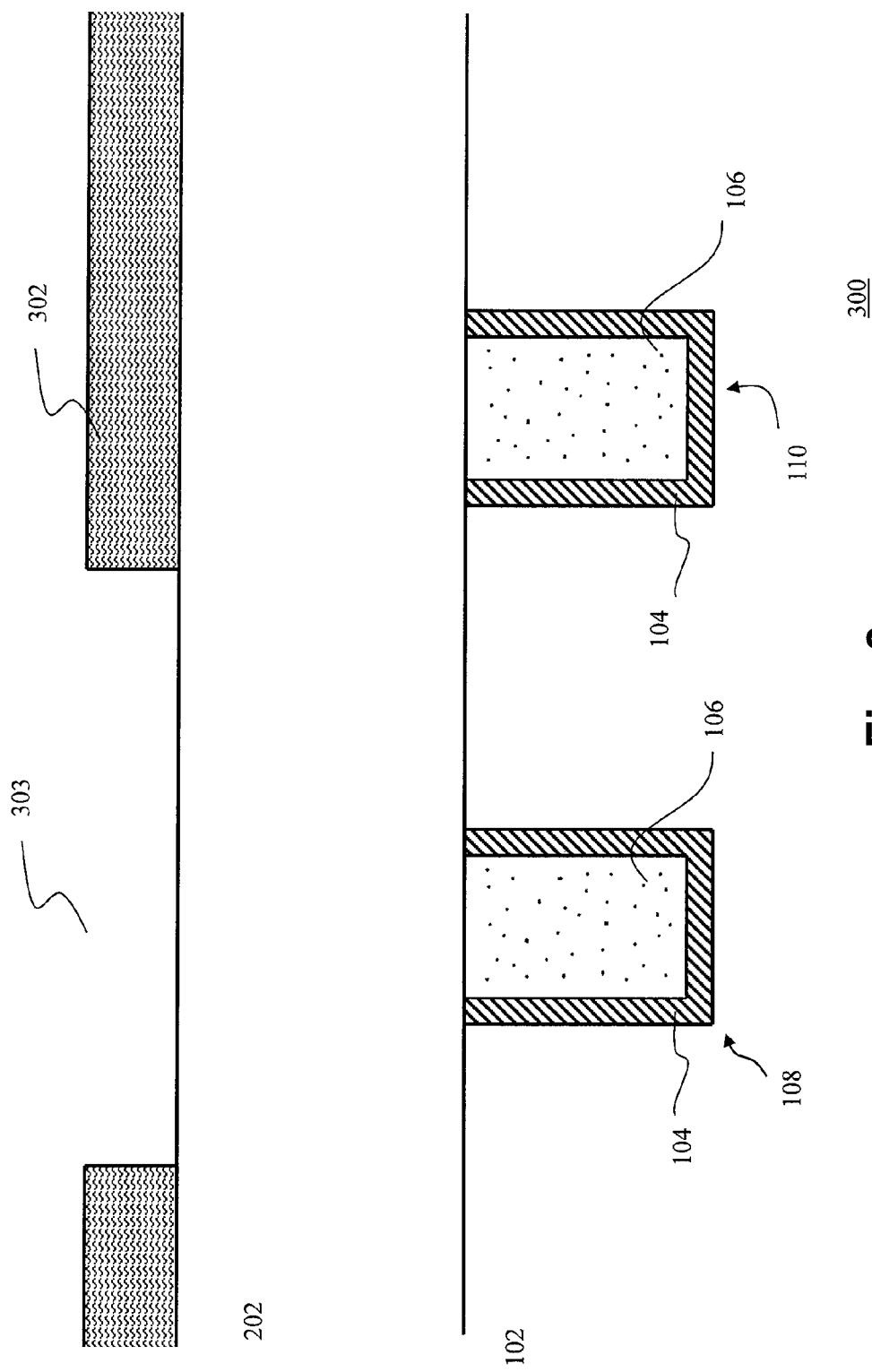
FIG. 3 is a follow-on view of the structure of a non-erodible mask.

With reference additionally now to FIG. 3, the structure of a photoresist non-erodible mask 300 is shown. Following the process in FIG. 3, the first contact stud 110 is masked over using a photoresist mask 302. Masking may be performed through a standard process of spin applying photoresist, imaging it and developing it leaving an opening 303

Figure 4:
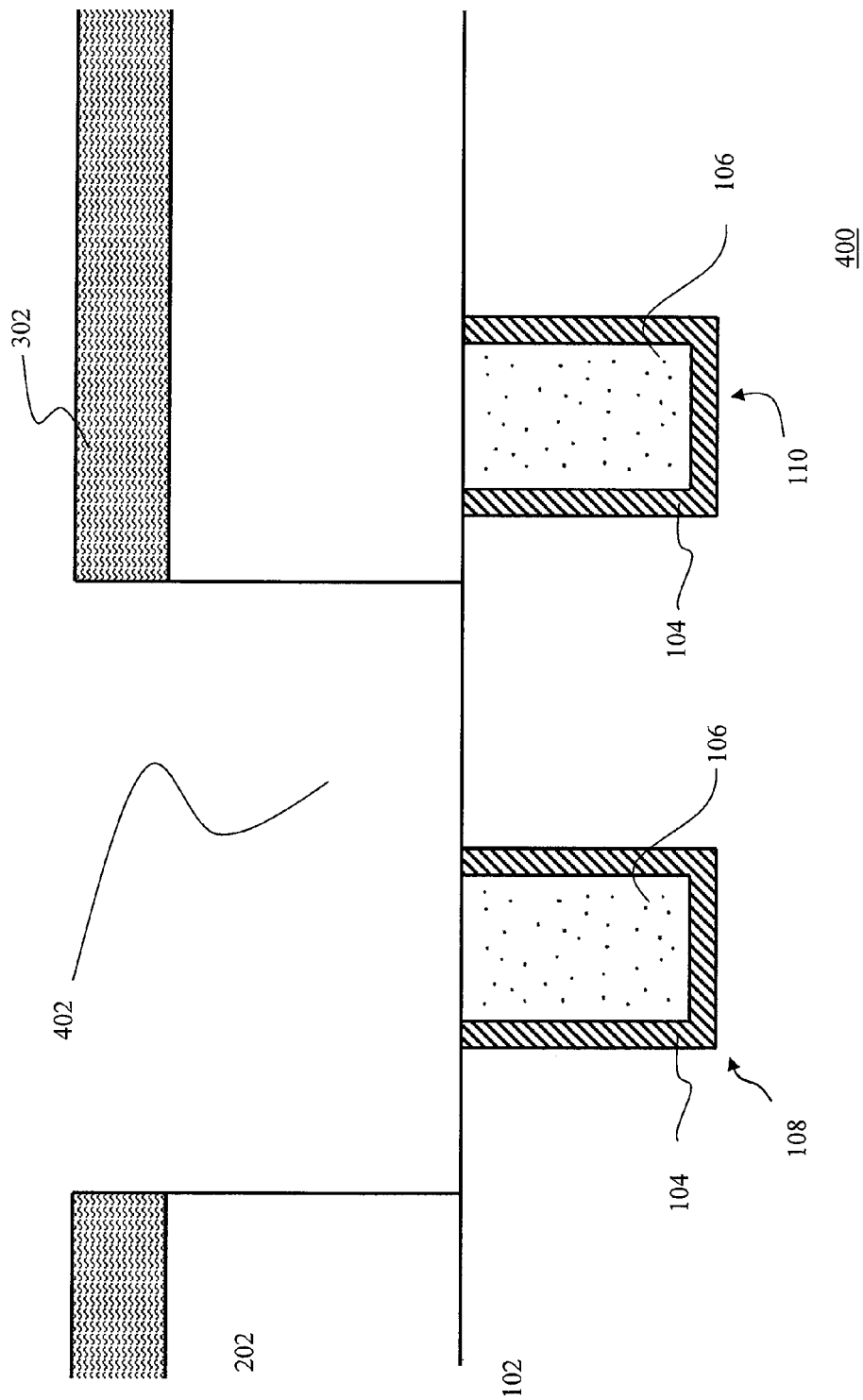
FIG. 4 is a follow-on view of the structure of the F-RAM opening.

With reference additionally now to FIG. 4, an F-RAM opening structure 400 is shown. In FIG. 4, the exposed portion of the thick oxide 202 layer surface is then etched away with a reactive-ion etching process using standard etch gases such as, but not limited, to $CF_4$ and $H_2$ in oxygen. This etching technique creates the F-RAM opening 402 where the F-RAM will be constructed. It should be noted that the BPSG layer 102 may be over etched and recessed (not shown).

Figure 5:
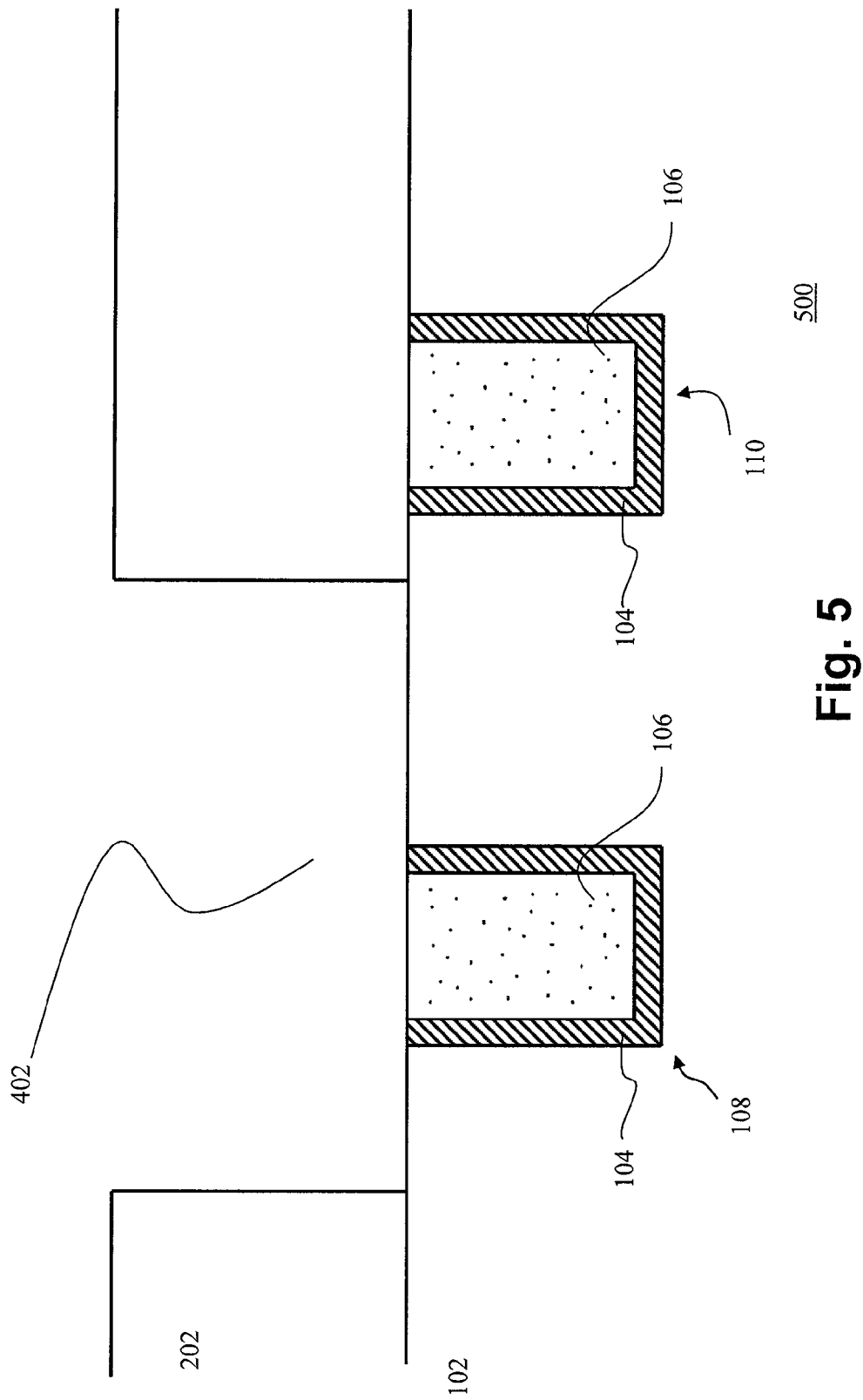
FIG. 5 is a follow-on view of the structure of the F-RAM opening after non-erodible mask is removed.

With reference additionally now to FIG. 5, the F-RAM opening structure 500 is shown with the photoresist mask removed from F-RAM opening structure 400. In FIG. 5, the photoresist mask 302 may be removed employing a standard $O_2$ plasma ash.

Figure 6:
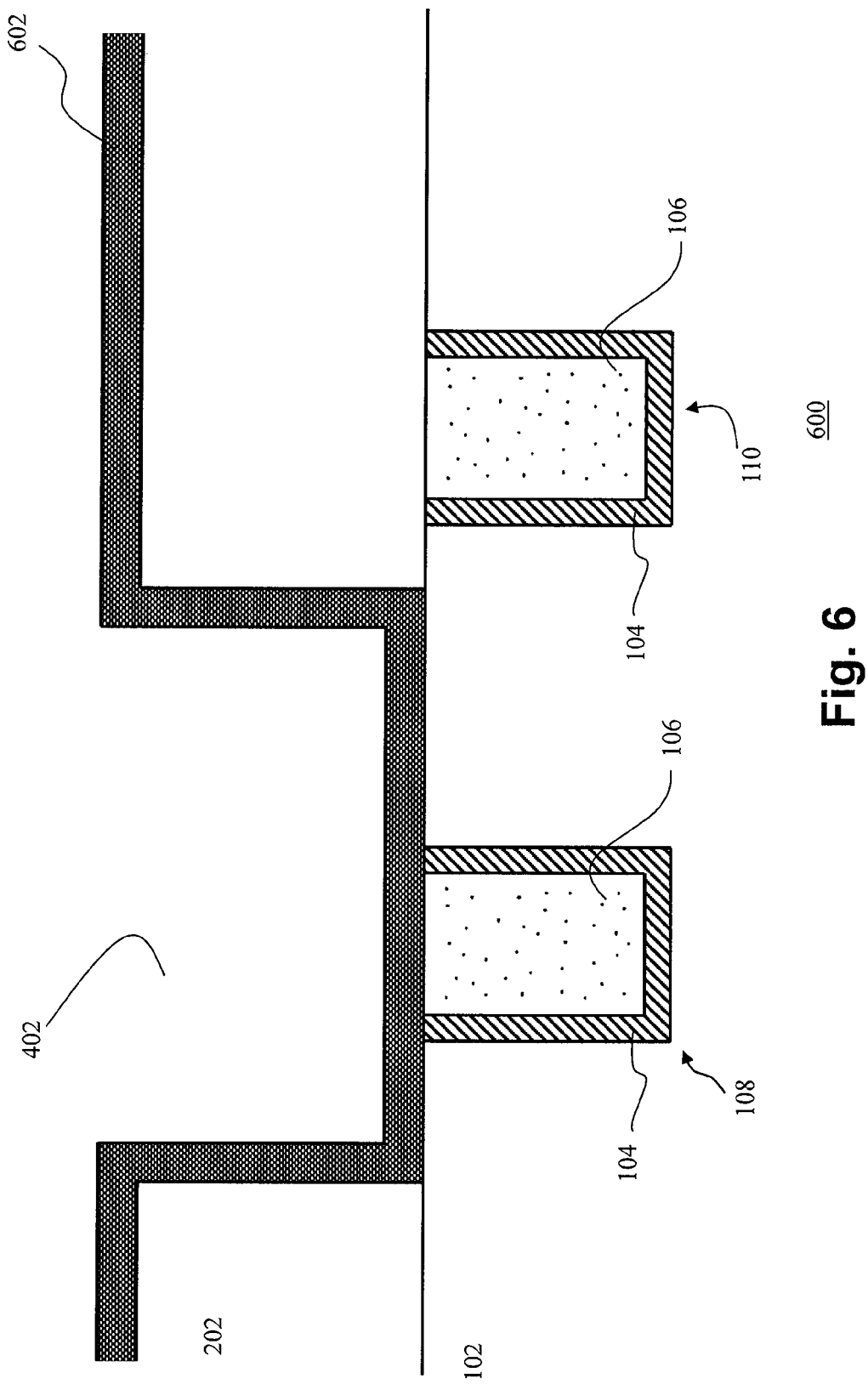
FIG. 6 is a follow-on view of the conformal CVD structure.

With reference additionally now to FIG. 6, the conformal CVD structure 600 is shown. In FIG. 6, a layer of between 2000 to 4000 angstroms of CVD aluminum oxide ($Al_2O_3$) is subsequently deposited over the F-RAM opening structure 500, forming a conformal CVD 602 layer of aluminum oxide on the top, sides and bottom of the thick oxide 202 layer.

Figure 7:
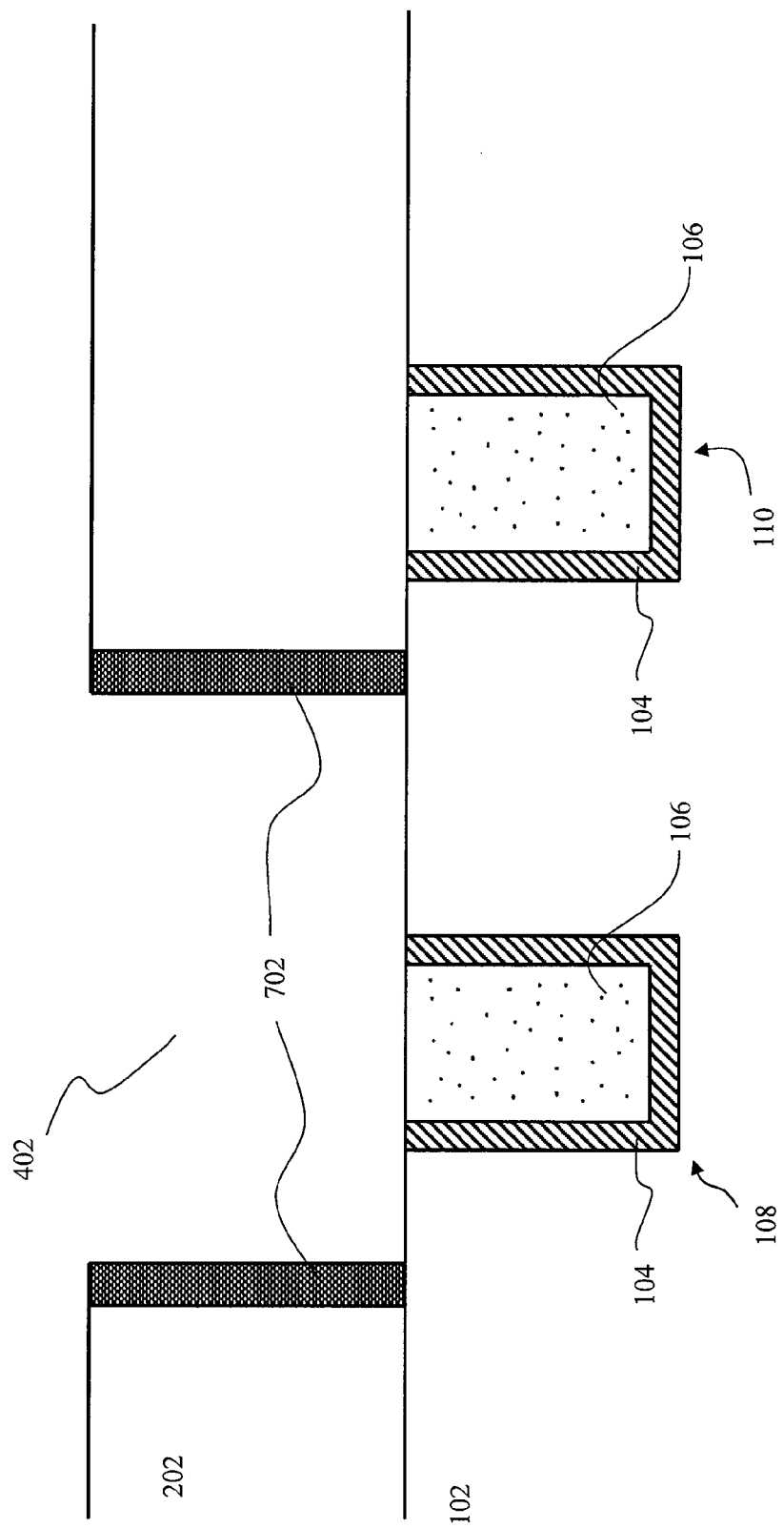
FIG. 7 is a follow-on view of the F-RAM structure with $Al_2O_3$ spacers.
Figure 8:
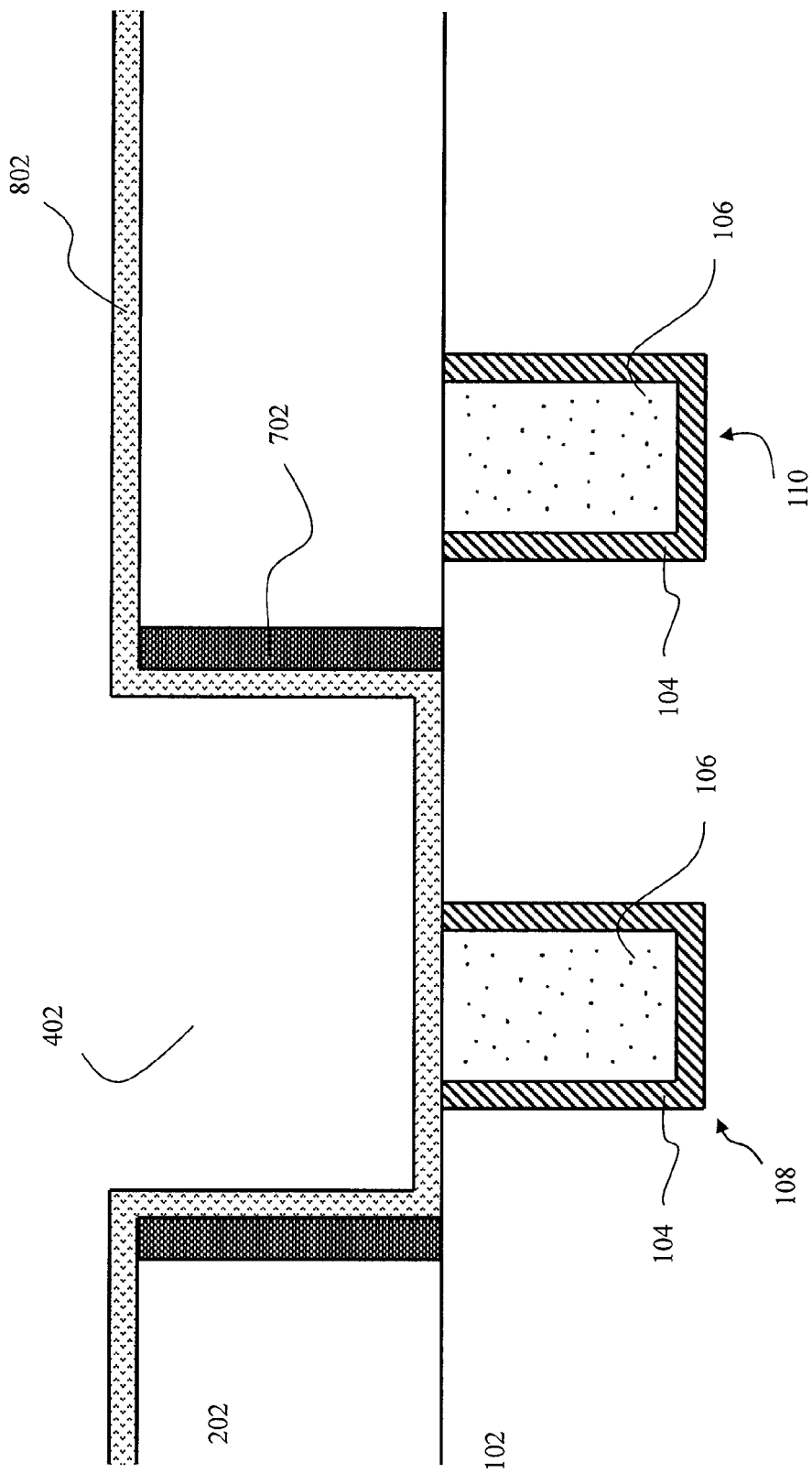
FIG. 8 is a follow-on view of the titanium aluminum nitride structure.

With reference additionally now to FIG. 7, the removal of a portion of the CVD $Al_2O_3$ material layer to create F-RAM structure with $AL_2O_3$ spacers 700 is depicted. In FIG. 7, the conformal CVD 602 layer is removed from the top and bottom using a reactive ion directional etch using $Cl_2/BCl_3/CCF_4/Ar$ on the planar surfaces leaving $Al_2O_3$ spacers 702. With reference additionally now to FIG. 8, the F-RAM structure with $AL_2O_3$ spacers 700 is shown with the addition of a conformal layer of about 1000 angstroms of titanium aluminum nitride film by a chemical vapor deposition (CVD) system. Titanium tetrachloride ($TiCl_4$), dimethylethylamine alane (DMEAA) and ammonia gas may be used as source gases. This forms titanium aluminum nitride structure 800. In FIG. 8, a layer of titanium aluminum nitride 802 is formed over the top of the F-RAM structure with $AL_2O_3$ spacers 700. Note that the titanium aluminum nitride 802 layer covers the sides and bottom of the F-RAM opening 402.

Figure 9:
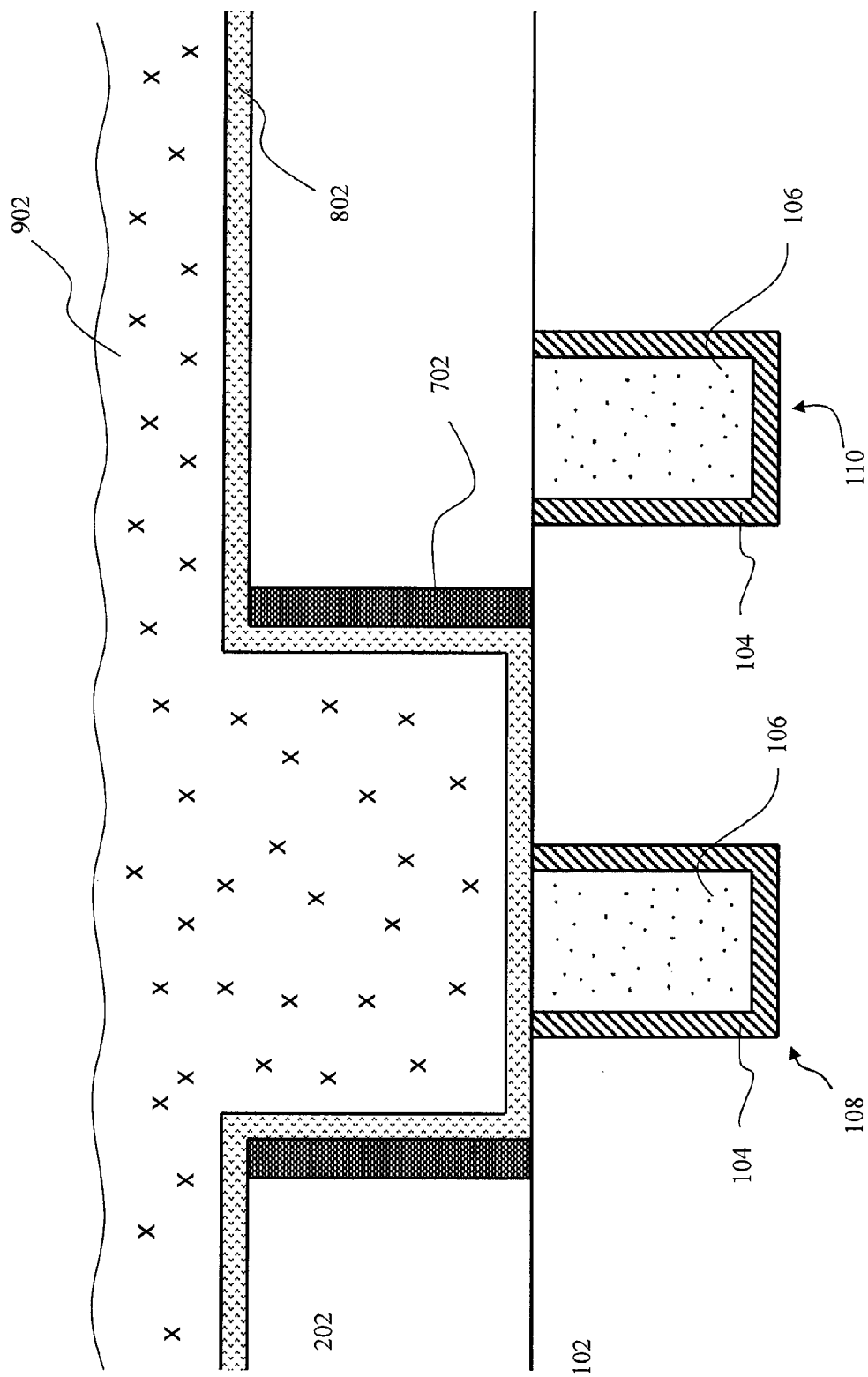
FIG. 9 is a follow-on view of the photoresist application structure.

With reference additionally now to FIG. 9, the application of a photoresist material on top of the titanium aluminum nitride structure 800 (titanium aluminum nitride) is shown, forming photoresist application structure 900. In FIG. 9, a photoresist 902 material is spun applied over the top of the titanium aluminum nitride structure 800 (titanium aluminum nitride).

Figure 10:
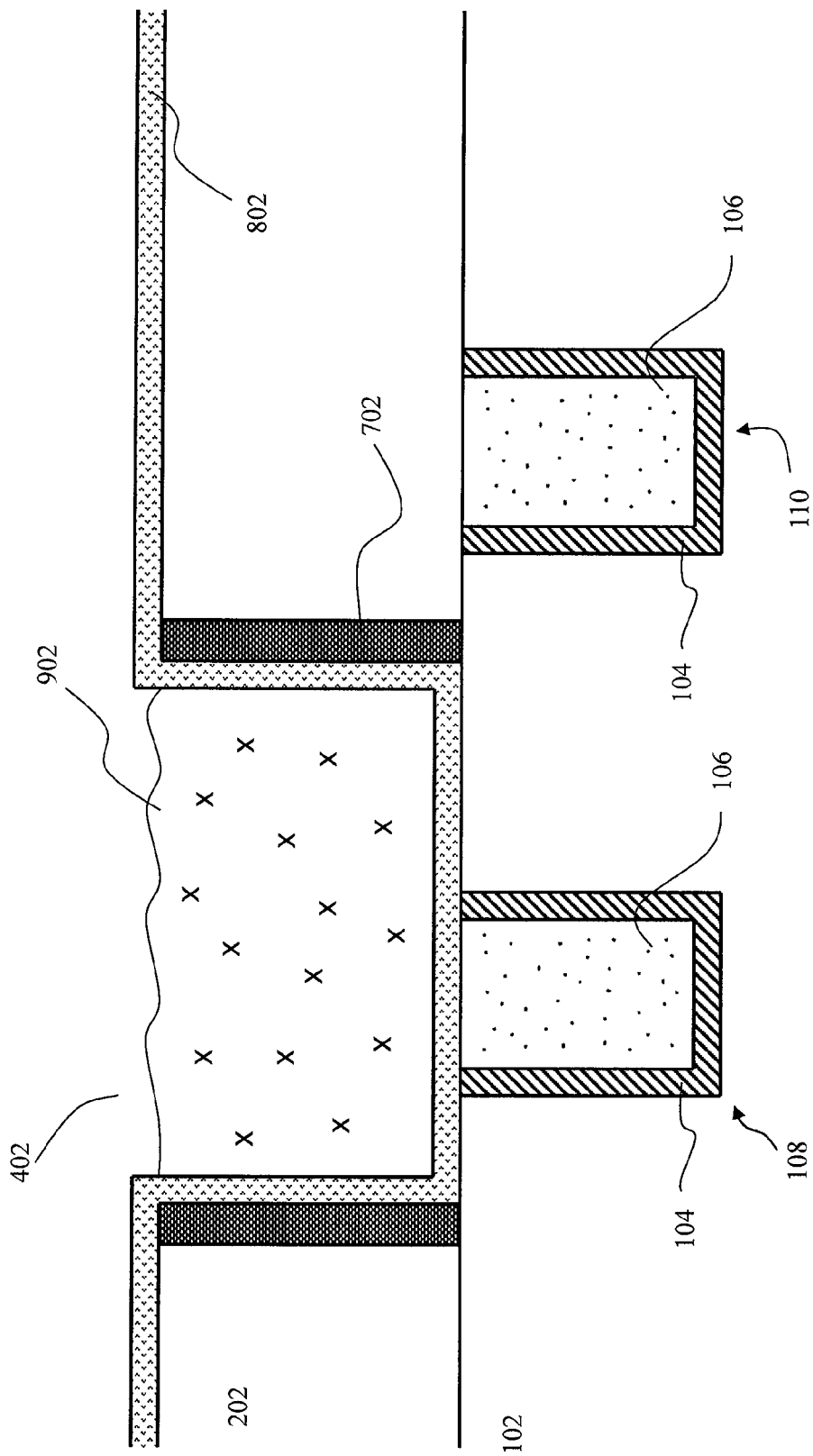
FIG. 10 is a follow-on view of the etched photoresist structure.

With reference additionally now to FIG. 10, the etching of the photoresist material in photoresist application structure 900 is shown to create etched photoresist structure 1000. In FIG. 10, the photoresist 902 material is etched back using an oxygen ($O_2$) plasma ash in order to shape a structure below the surface of the titanium aluminum nitride 802 layer, leaving the photoresist 902 materials in the F-RAM opening 402.

Figure 11:
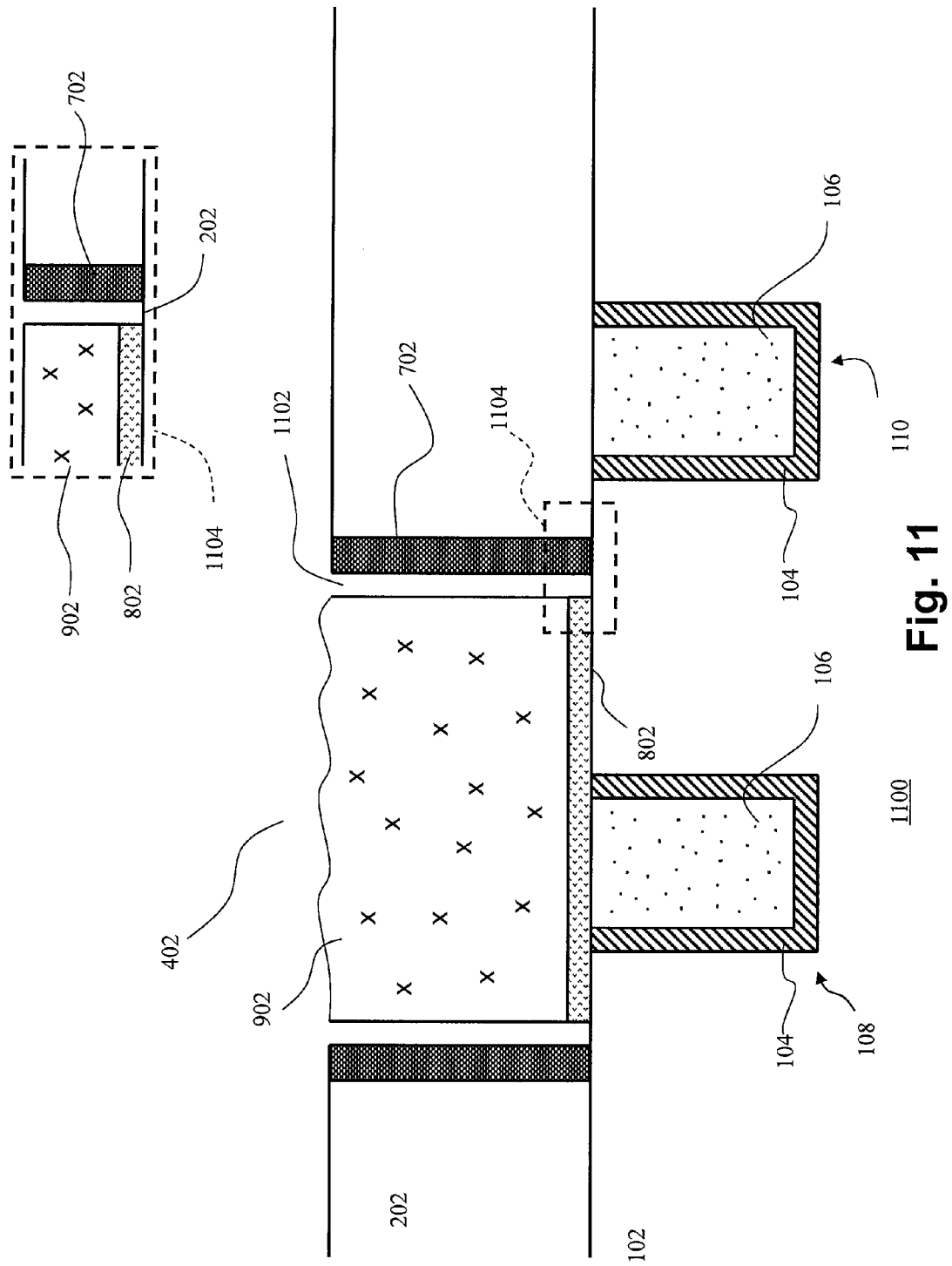
FIG. 11 is a follow-on view of the etched titanium aluminum nitride structure.

With reference additionally now to FIG. 11, the removal of the exposed regions of the titanium aluminum nitride 802 layer in the etched photoresist structure 1000 is shown to create etched titanium aluminum nitride structure 1100 (etched titanium aluminum nitride). The titanium aluminum nitride is wet etched. In FIG. 11, the titanium aluminum nitride 802 layer is etched away exposing the base of the thick oxide 202 layer and also forming thin etched openings 1102 between the photoresist 902 material and the $Al_2O_3$ spacers 702.

An enhanced view of section 1104 is shown (above-right) to detail the structure formed after the etching away of the titanium aluminum nitride 802 layer. Section 1104 illustrates how the titanium aluminum nitride 802 coating is etched back to the base of the thick oxide 202 layer, leaving a layer of titanium aluminum nitride 802 only below the remaining photoresist 902 material.

Figure 12:
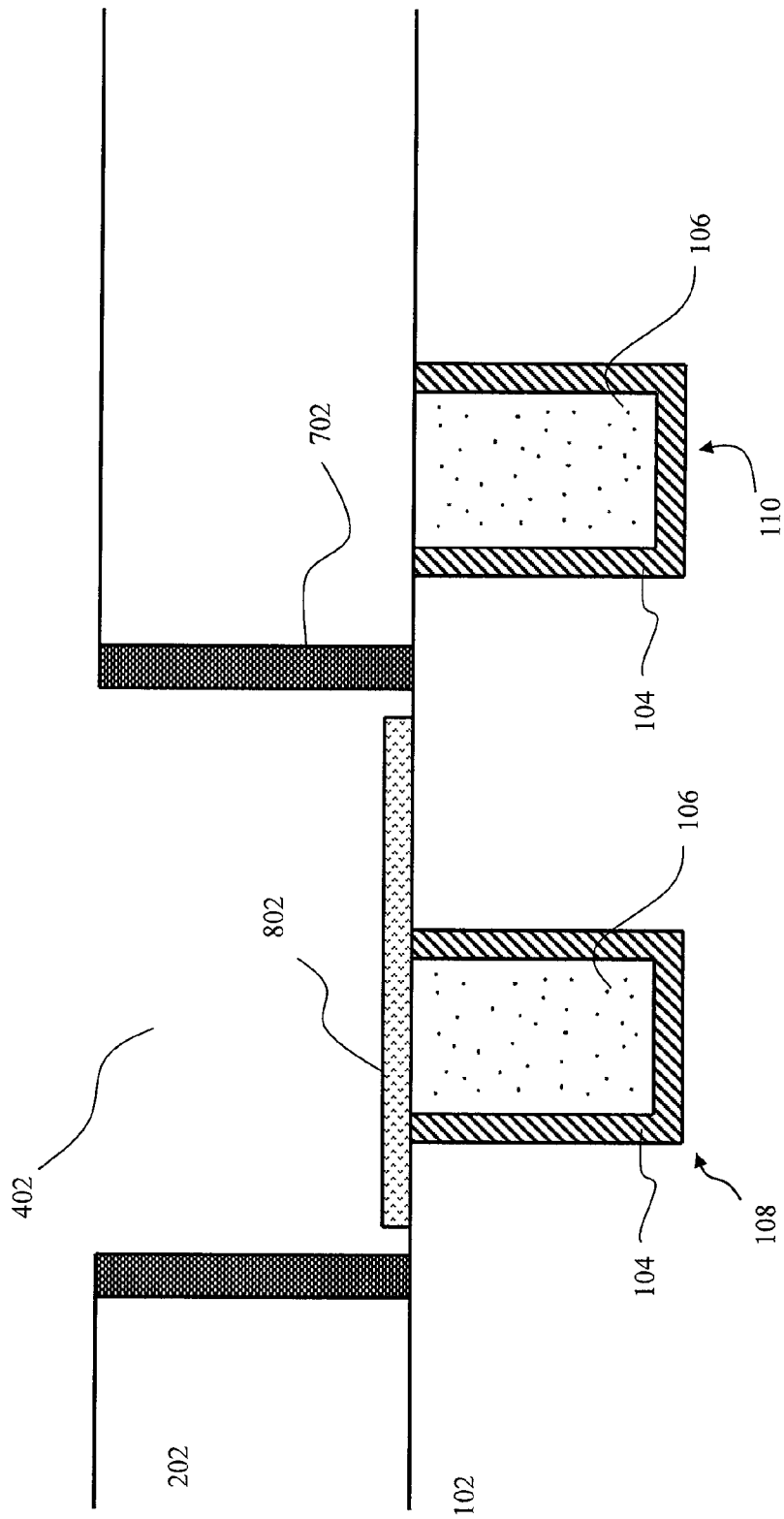
FIG. 12 is a follow-on view of the F-RAM titanium aluminum nitride structure.

With reference additionally now to FIG. 12, the removal of the remainder of the photoresist material in the etched titanium aluminum nitride structure 1100 (etched titanium aluminum nitride) is shown, forming F-RAM titanium aluminum nitride structure 1200. In FIG. 12, the photoresist 902 material is completely removed by the same $O_2$ plasma ash process described above. Note that a titanium aluminum nitride 802 layer remains on the base of the thick oxide 202 in the F-RAM opening 402.

Figure 13:
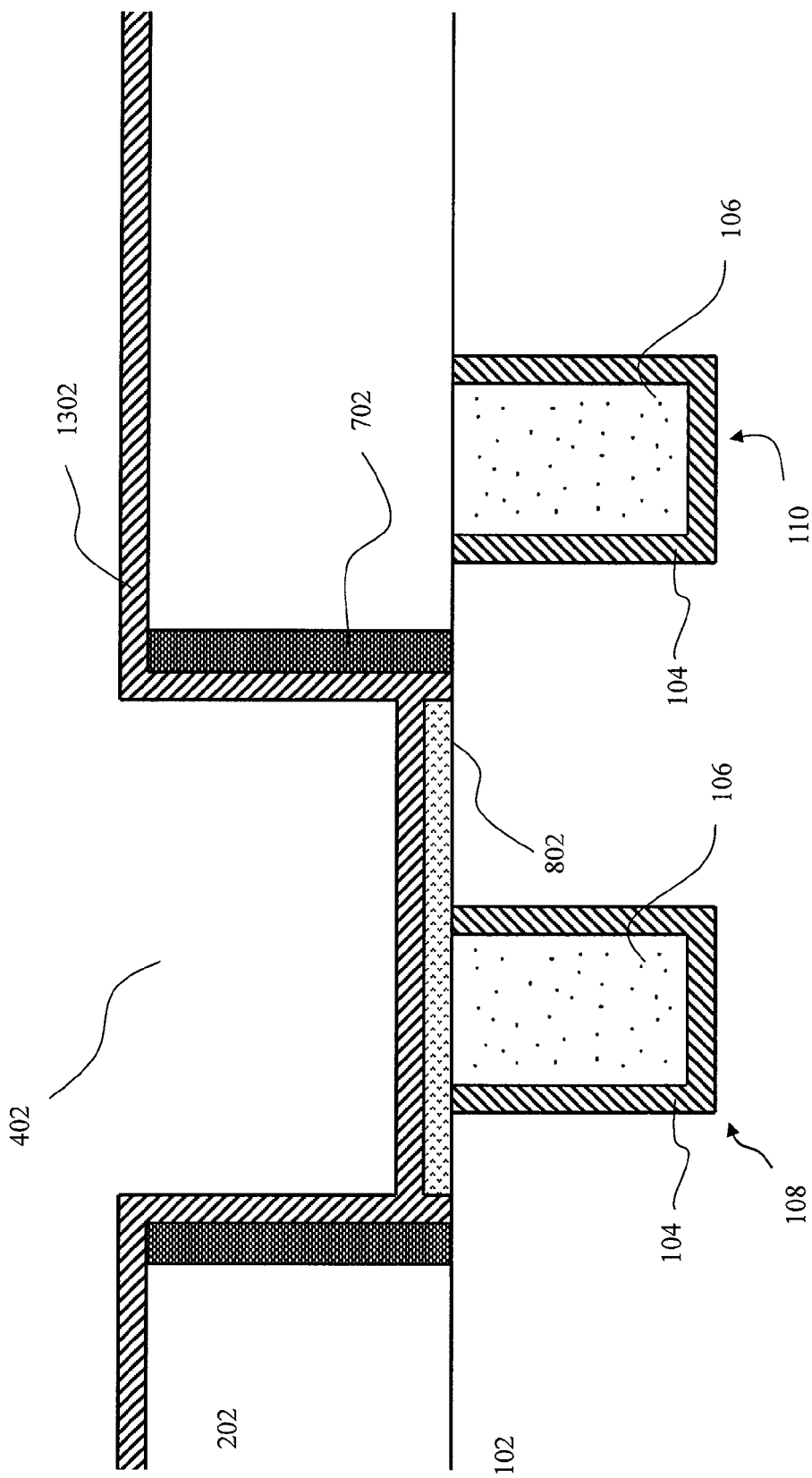
FIG. 13 is a follow-on view of the F-RAM platinum structure.

With reference additionally now to FIG. 13, a layer of CVD platinum deposited over the top of the F-RAM titanium aluminum nitride structure 1200 is shown, forming F-RAM platinum structure 1300. In FIG. 13, a conformal platinum 1302 layer of 500 to 1000 angstroms is deposited by chemical vapor deposition over the top of the F-RAM titanium aluminum nitride structure 1200.

This platinum 1302 layer covers the top and bottom of the thick oxide 202, the top of the titanium aluminum nitride 802 layer and sidewalls of the $Al_2O_3$ spacers 702.

Figure 14:
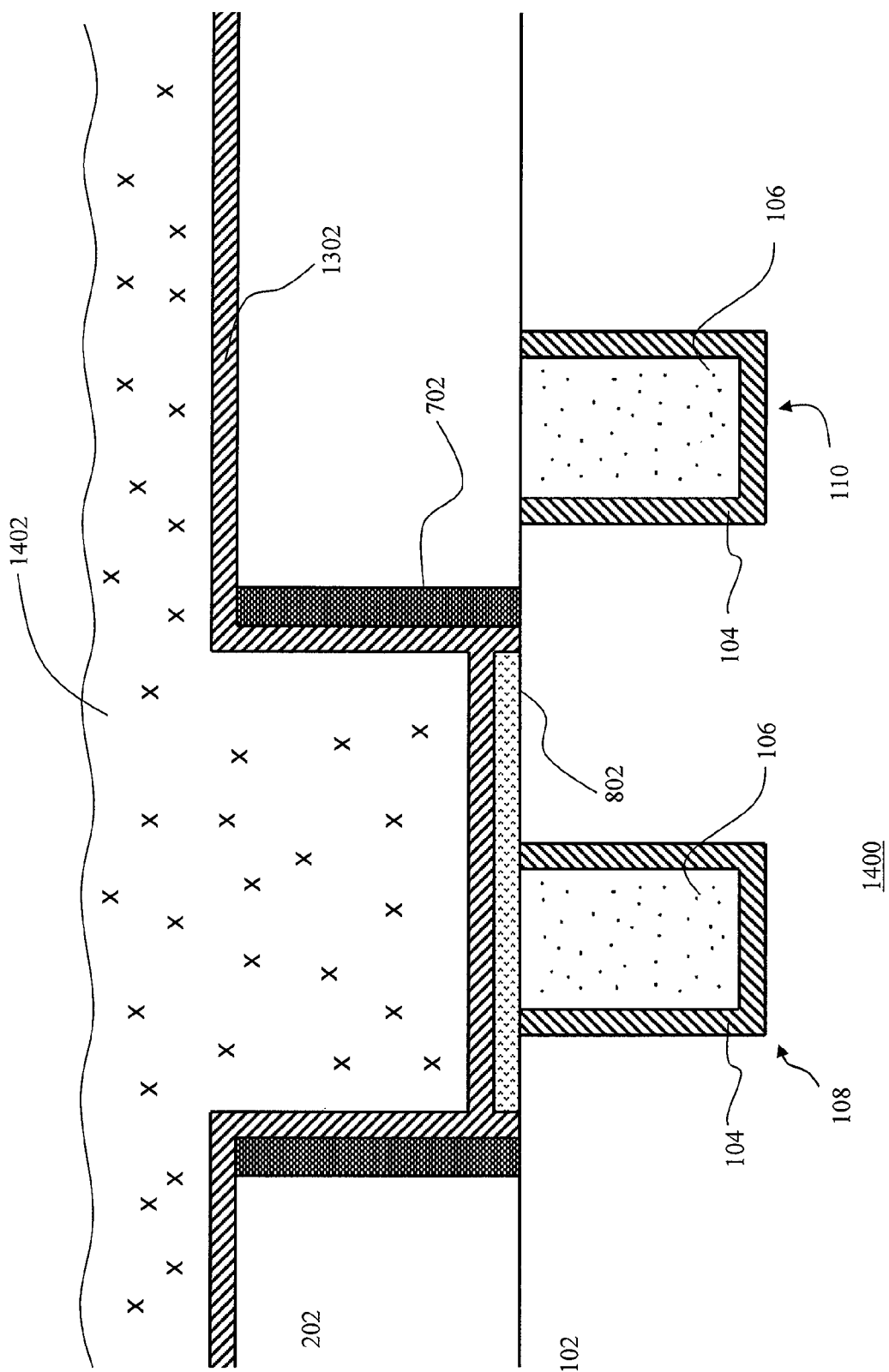
FIG. 14 is a follow-on view of the second photoresist application structure.

With reference additionally now to FIG. 14, an application of photoresist material on top of the F-RAM platinum structure 1300 is shown, forming the second photoresist application structure 1400. In FIG. 14, a photoresist 1402 material is applied for the second time (as in FIG. 9) over the top of the F-RAM platinum structure 1300.

Figure 15:
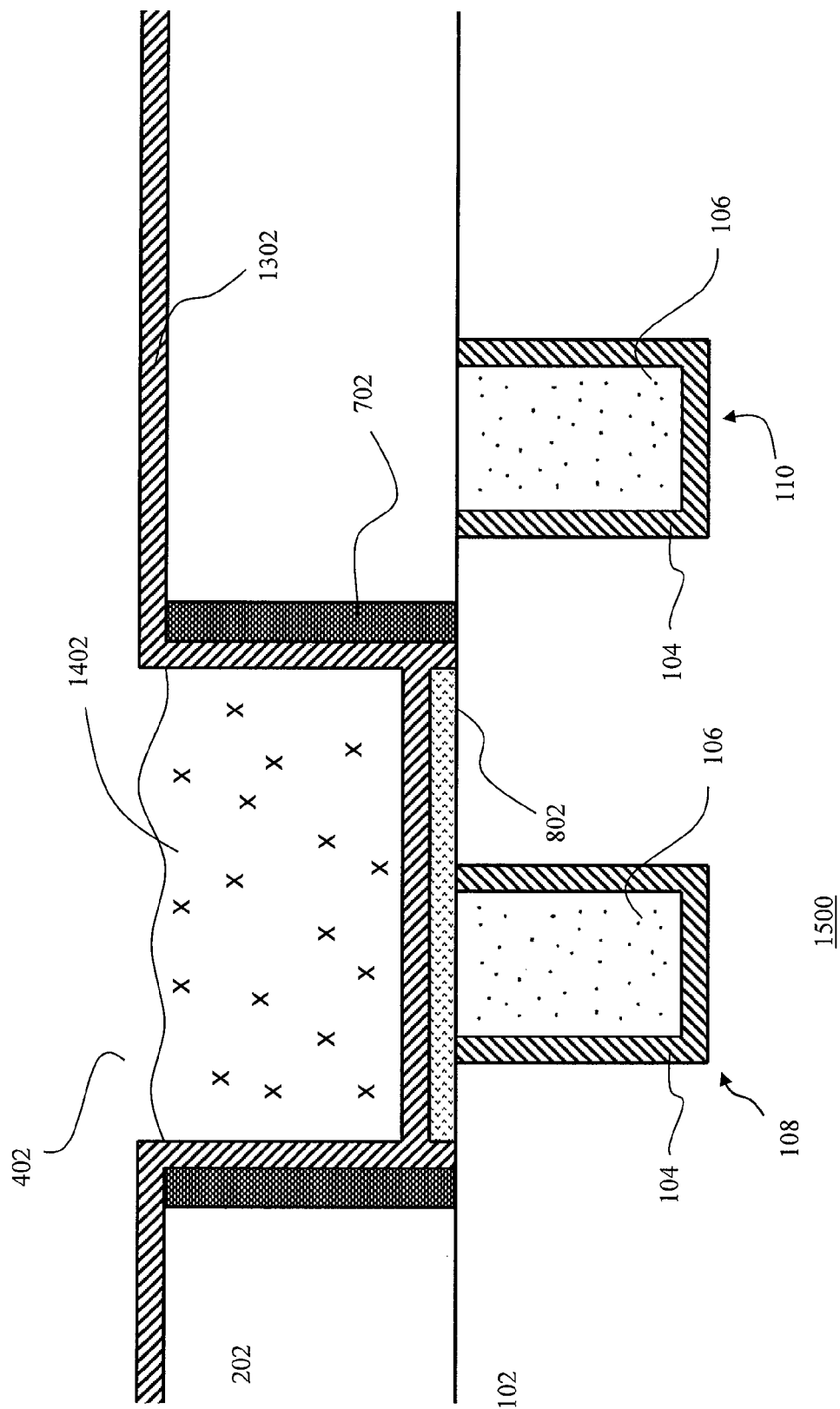
FIG. 15 is a follow-on view of the etched photoresist structure.

With reference additionally now to FIG. 15, the removal of a portion of the photoresist material in the second photoresist application structure 1400 is shown, forming etched photoresist structure 1500. In FIG. 15, the photoresist 1402 material is etched back using an oxygen ($O_2$) plasma ash in order to shape a structure below the surface of the conformal platinum 1302 layer. This etching process leaves the photoresist 1402 material only in the F-RAM opening 402.

Figure 16:
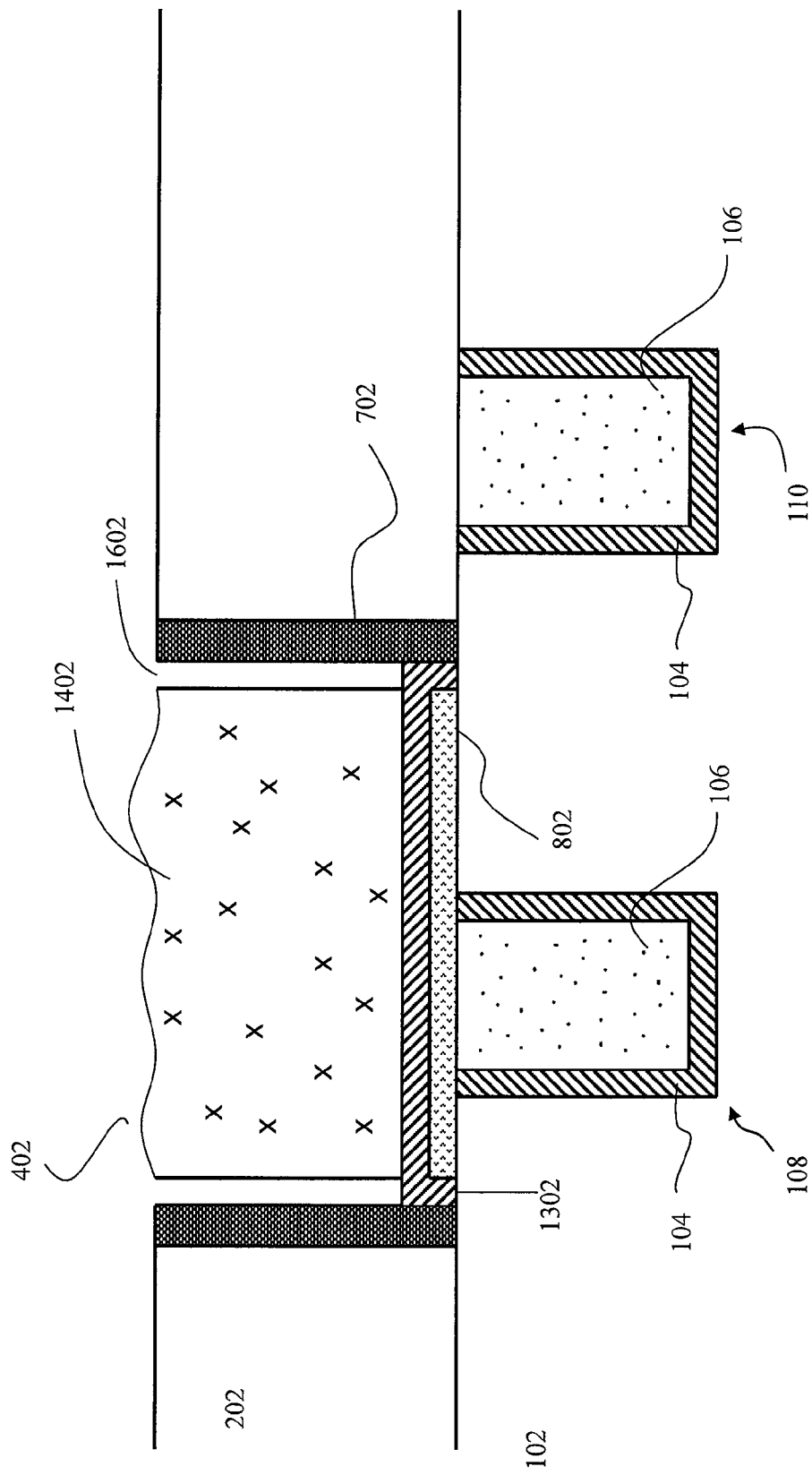
FIG. 16 is a follow-on view of the etched platinum structure.

With reference additionally now to FIG. 16, the removal of a portion of the platinum layer in the etched photoresist structure 1500 is depicted, creating etched platinum structure 1600. In FIG. 16, the conformal platinum 1302 layer is etched away from the top of the thick oxide 202 and the sides of the $Al_2O_3$ spacers 702, forming a second etched opening 1602 between the photoresist 1402 material and the $Al_2O_3$. Note that in this process step the platinum 1302 layer is not etched all the way back to base of the thick oxide 202 layer in the F-RAM opening 402. Platinum is typically etched using a wet etch in an argon or chlorine atmosphere, although other gases may be used. Ion milling can be used as well as an alternative etching technique. As illustrated in FIG. 16, the photoresist 1402 material is left on top of the platinum 1302 layer in the F-RAM opening 402.

Figure 17:
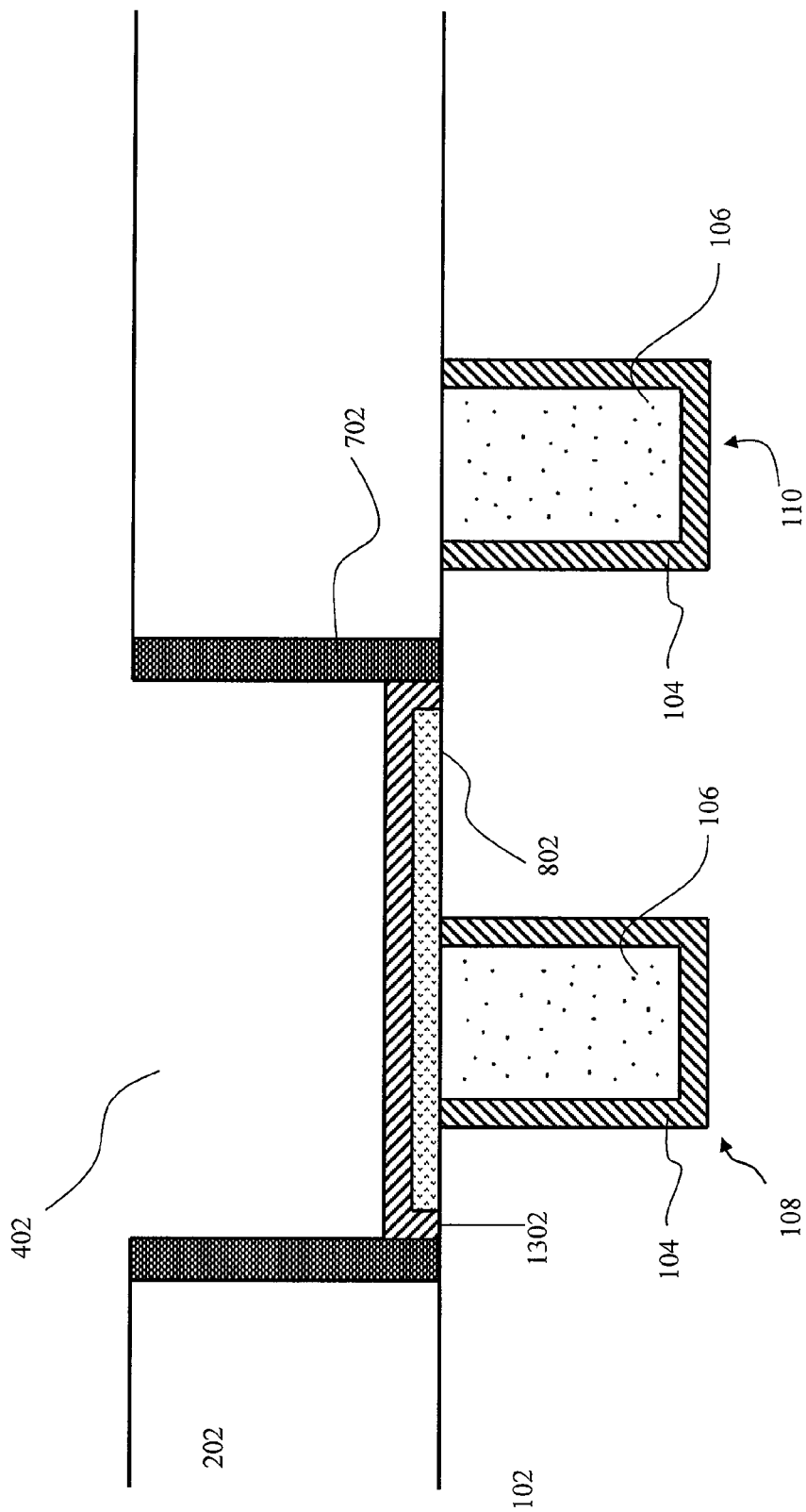
FIG. 17 is a follow-on view of the F-RAM platinum titanium aluminum nitride structure.

With reference additionally now to FIG. 17, the removal of the remainder of the photoresist material from the etched platinum structure 1600 is depicted, creating F-RAM platinum titanium aluminum nitride structure 1700 (titanium aluminum nitride). In FIG. 17, just the photoresist 1402 material is etched away using an $O_2$ plasma ash etching technique and removed with a vacuum pump. Note that in this process step, the titanium aluminum nitride 802 layer remains at the base of the thick oxide 202 layer, with the platinum 1302 layer positioned above the titanium aluminum nitride 802 layer and is also in contact with the base of the thick oxide 202 layer.

Figure 18:
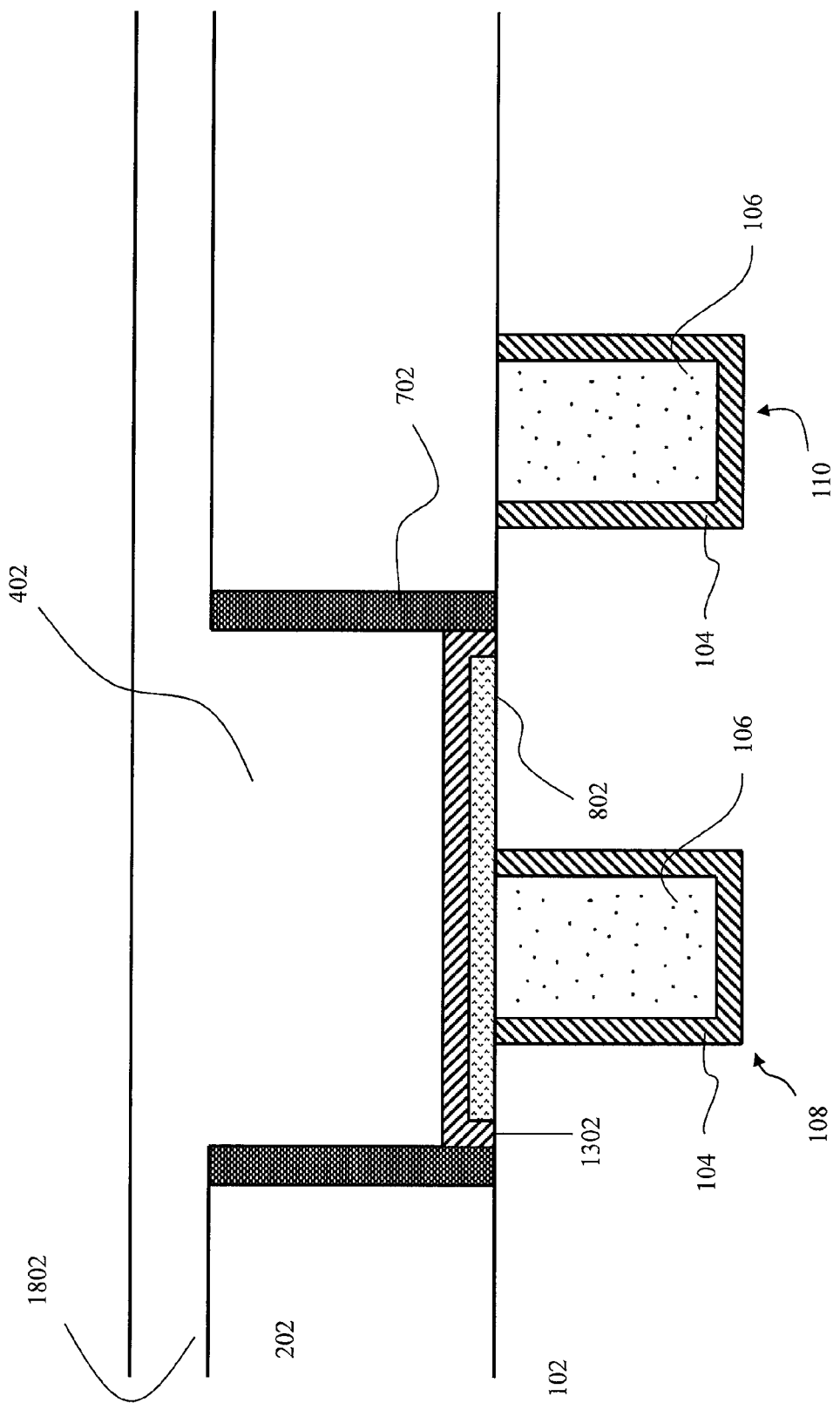
FIG. 18 is a follow-on view of the oxide deposition structure.

With reference additionally now to FIG. 18, the deposition of an oxide layer over the top of the F-RAM platinum titanium aluminum nitride structure 1700 (titanium aluminum nitride) is shown, creating oxide deposition structure 1800. In FIG. 18, an oxide 1802 layer thick enough to completely fill the F-RAM opening 402 is formed.

Figure 19:
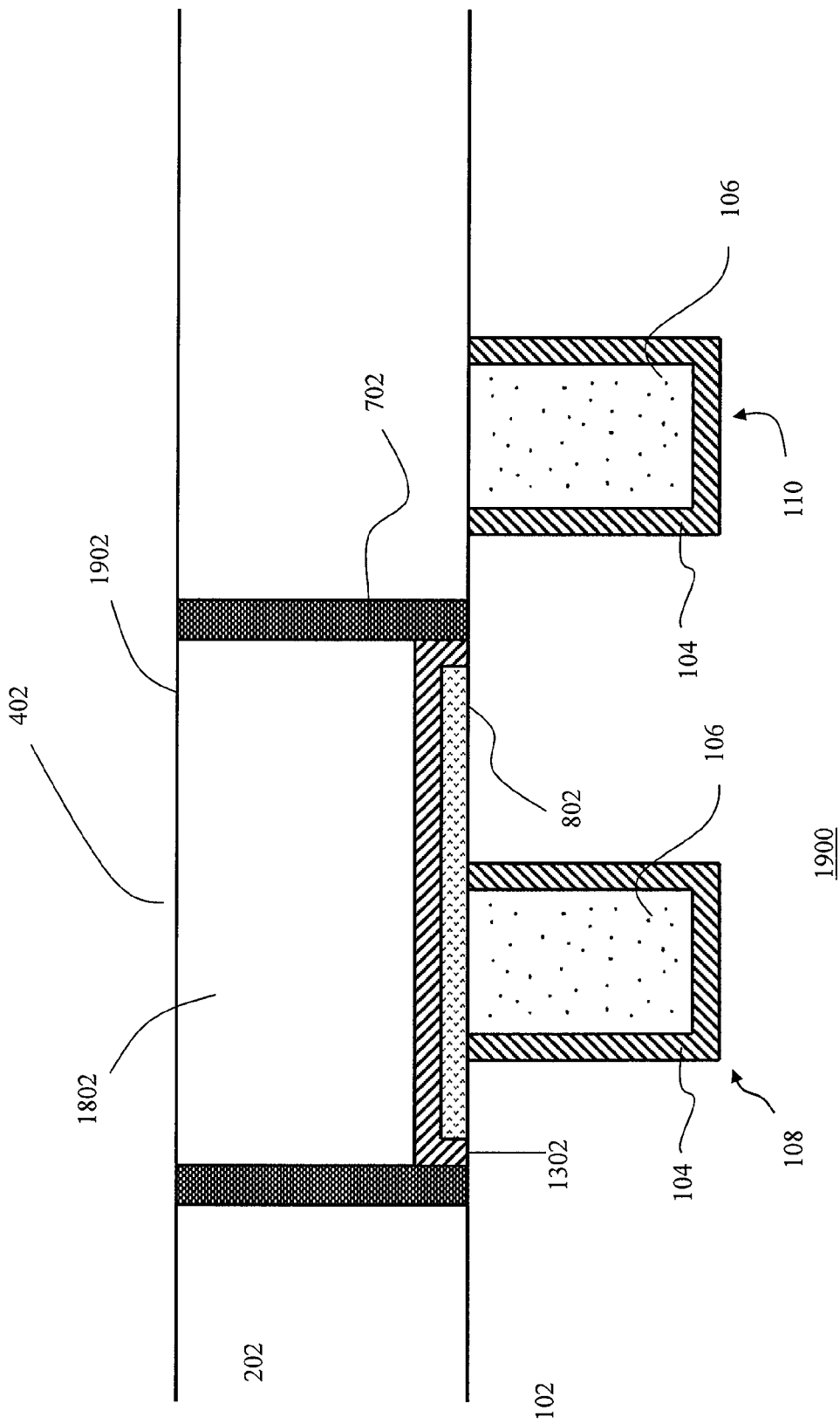
FIG. 19 is a follow-on view of the CMP oxide structure.

With reference additionally now to FIG. 19, the removal of the oxide material in the oxide deposition structure 1800 is shown to form CMP oxide structure 1900. In FIG. 19, CMP is used once more to polish away the oxide 1802 material all the way back to the level of the thick oxide 202 to form a planar surface 1902 on top of the thick oxide 202. Notice that the oxide 1802 remains embedded in F-RAM opening 402 and is planar to the top surface of the thick oxide 202.

Figure 20:
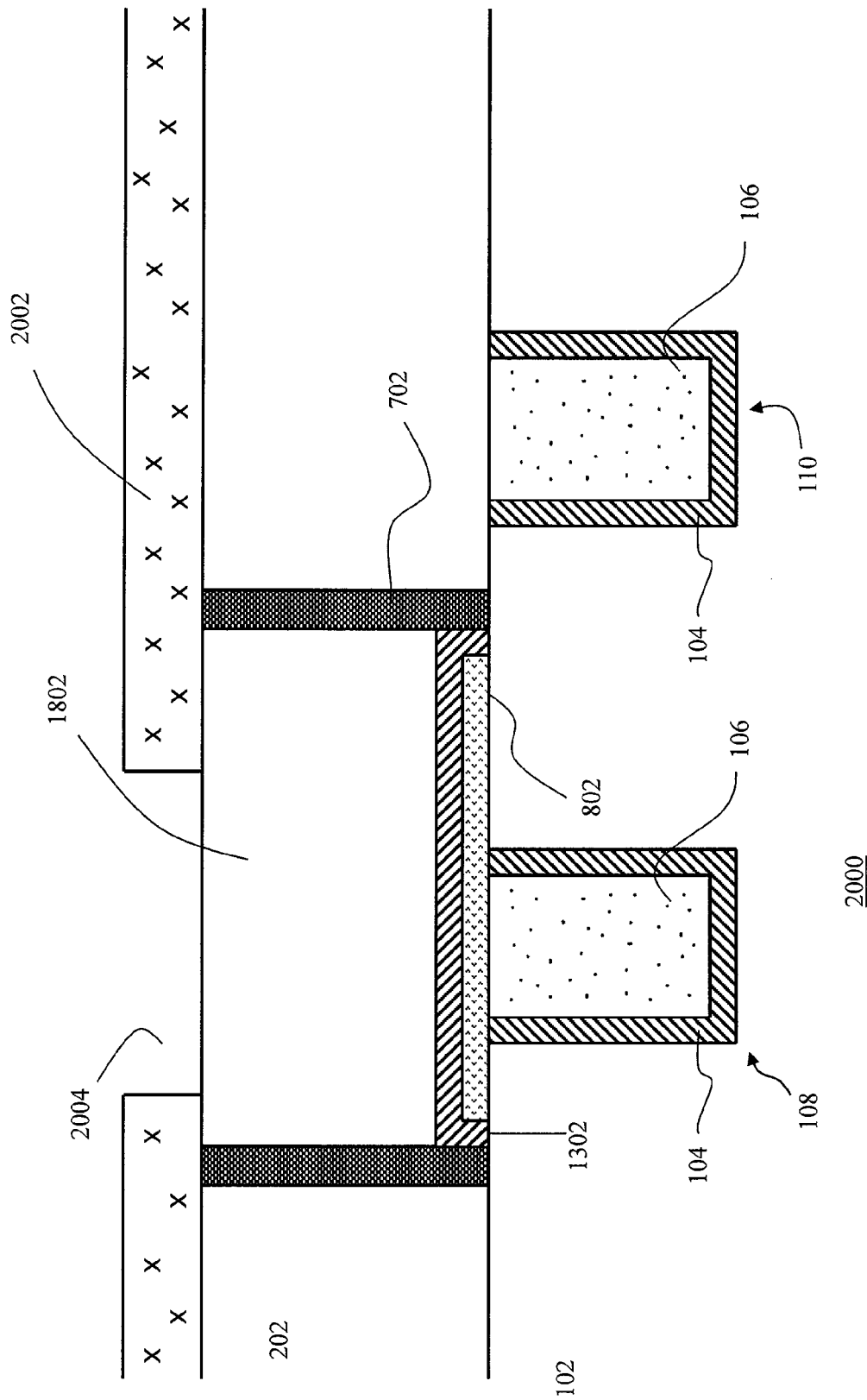
FIG. 20 is a follow-on view of the photoresist mask structure.

With reference additionally now to FIG. 20, the application of a photoresist mask over the CMP oxide structure 1900 is shown, creating photoresist mask structure 2000. In FIG. 20, a photoresist mask 2002 is deposited over the CMP oxide structure 1900 and then imaged and developed to form a mask opening 2004. This step leaves the oxide 1802 partially exposed in the area of the F-RAM opening 402.

Figure 21:
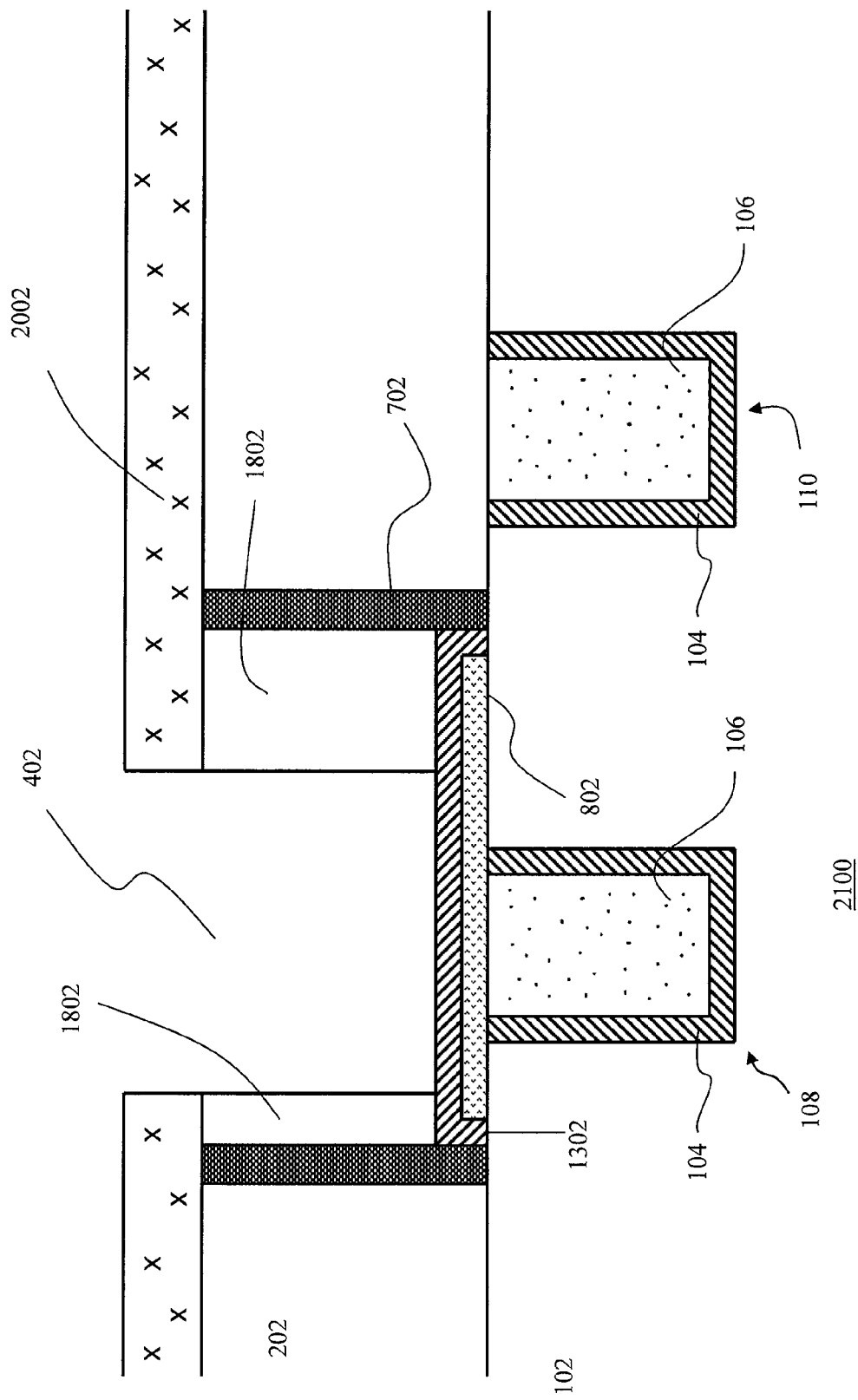
FIG. 21 is a follow-on view of the etched oxide structure.

With reference additionally now to FIG. 21, the etching of the exposed oxide in the photoresist mask structure 2000 is shown, forming etched oxide structure 2100. According to the pattern created by the photoresist mask 2002, the oxide 1802 material in the F-RAM opening 402 is etched down to the platinum 1302 layer. This oxide 1802 material can be removed using reactive-ion etch processing. This step creates oxide 1802 layers on each side of the F-RAM opening 402.

Figure 22:
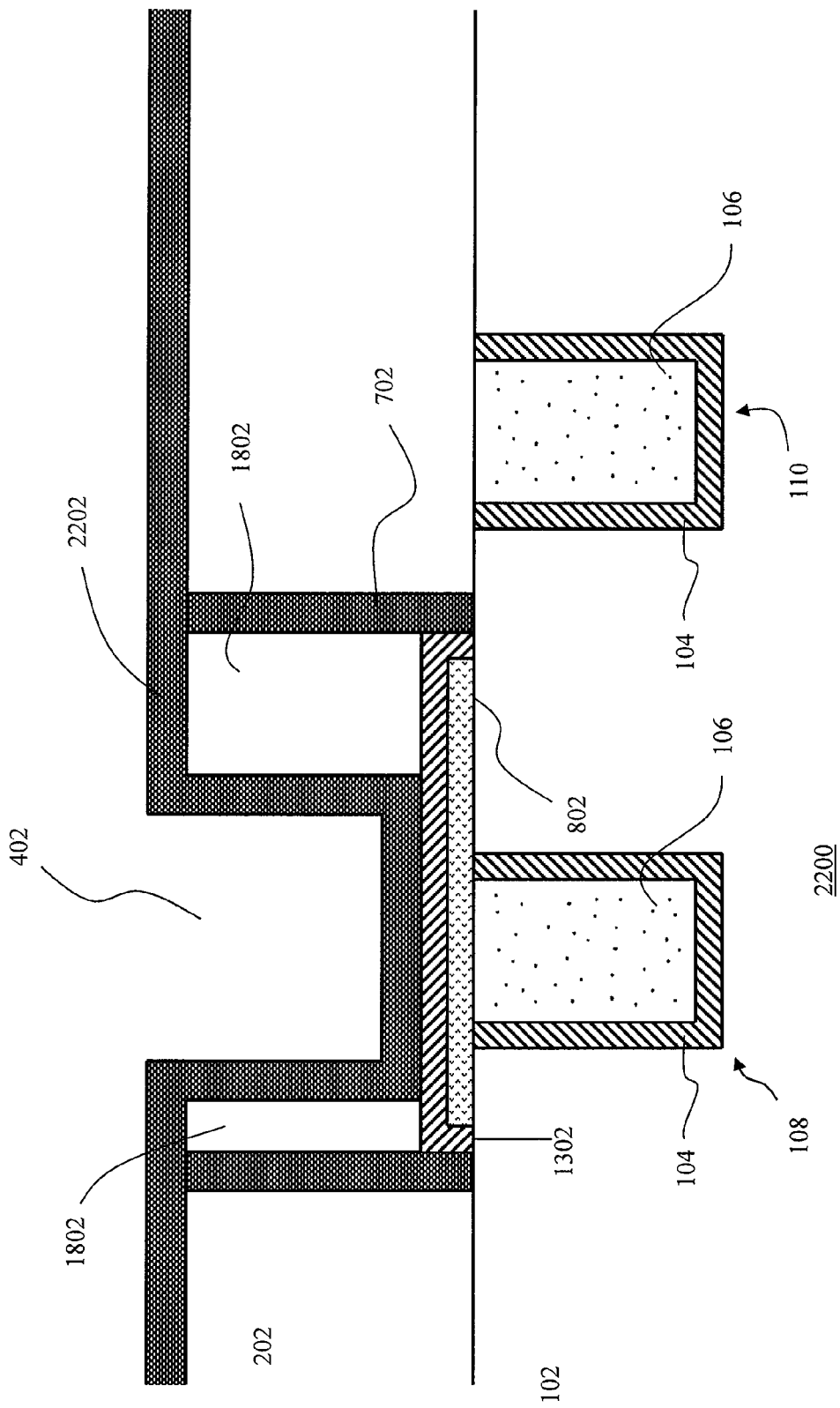
FIG. 22 is a follow-on view of the second conformal CVD structure.

With reference additionally now to FIG. 22, the formation of the second conformal CVD structure 2200 is shown. In FIG. 22, the photoresist mask 2002 is subsequently removed using the same $O_2$ plasma ash etching technique described above. A second layer of 1000 to 2000 angstroms of $Al_2O_3$ is then deposited using chemical vapor deposition (as in FIG. 6) over the top of the thick oxide 202, the etched oxide 1802, the platinum 1302 and the sides and bottom of the F-RAM opening 402, forming a another conformal CVD oxide 2202 layer of $Al_2O_3$.

Figure 23:
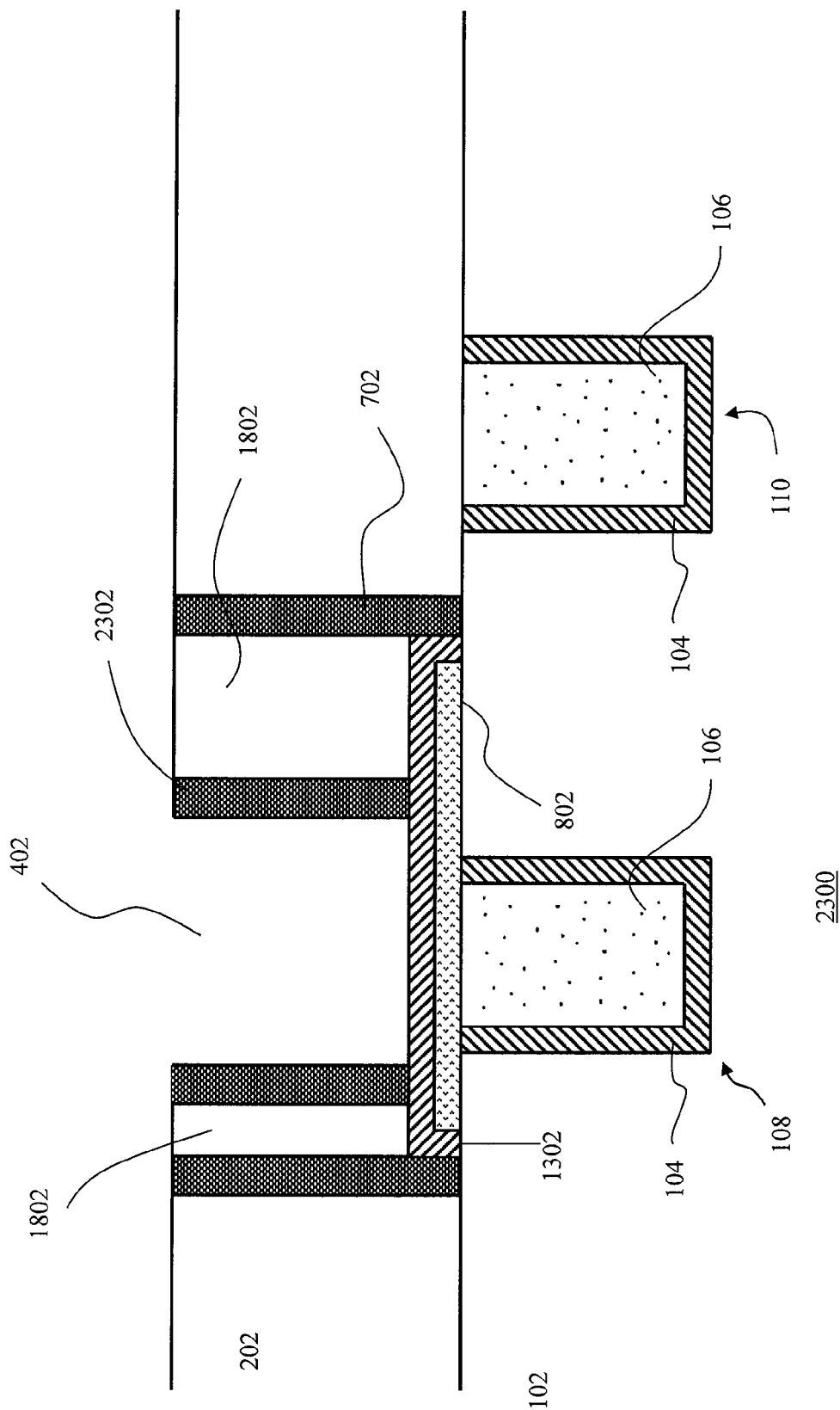
FIG. 23 is a follow-on view of the F-RAM $Al_2O_3$ structure.

With reference additionally now to FIG. 23, the removal of a portion of the conformal CVD layer from the second conformal CVD structure 2200 is shown, forming an F-RAM $Al_2O_3$ structure 2300. In FIG. 23, the conformal CVD oxide 2202 layer is etched away from the planar regions of the thick oxide 202 with a directional reactive-ion etch, forming the second set of $Al_2O_3$ spacers 2302. Note that in this step, the conformal CVD oxide 2202 layer of $Al_2O_3$ remains along the sides of F-RAM opening 402.

Figure 24:
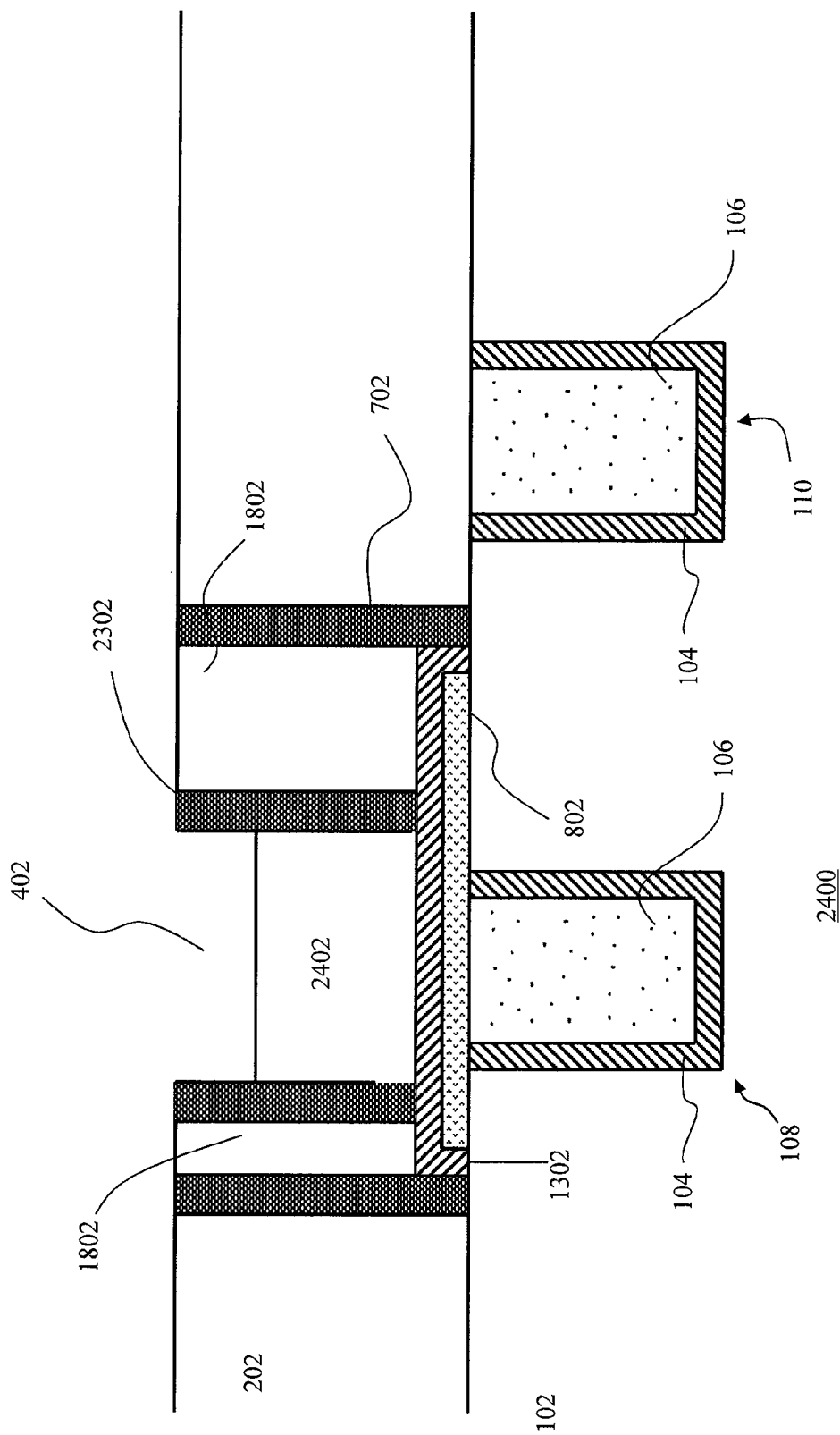
FIG. 24 is a follow-on view of the F-RAM PZT structure.

With reference additionally now to FIG. 24, the addition of a ferroelectric layer to the F-RAM $Al_2O_3$ structure 2300 is shown, creating F-RAM PZT structure 2400. In FIG. 24, a first ferroelectric layer, ideally doped with PZT (lead zirconium titanate), PZT 2402 material is deposited, planarized and then etched back into F-RAM opening 402. The PZT 2402 material is formed of lead (Pb), zirconium (Zr), and titanate (Ti) atoms, with an atomic ratio of the Zr atoms to the Ti atoms (Zr:Ti) of less than 2:3. After the PZT 2402 material is deposited, a first anneal is performed to crystallize the PZT 2402 material. This involves a 650° C. heat treatment for about five seconds followed by another heat treatment at 850° C. for another 5 seconds. While PZT 2402 is used as the ferroelectric layer, other known ferroelectric compounds such as strontium bismuth tantalate (SBT) may also be employed.

Figure 25:
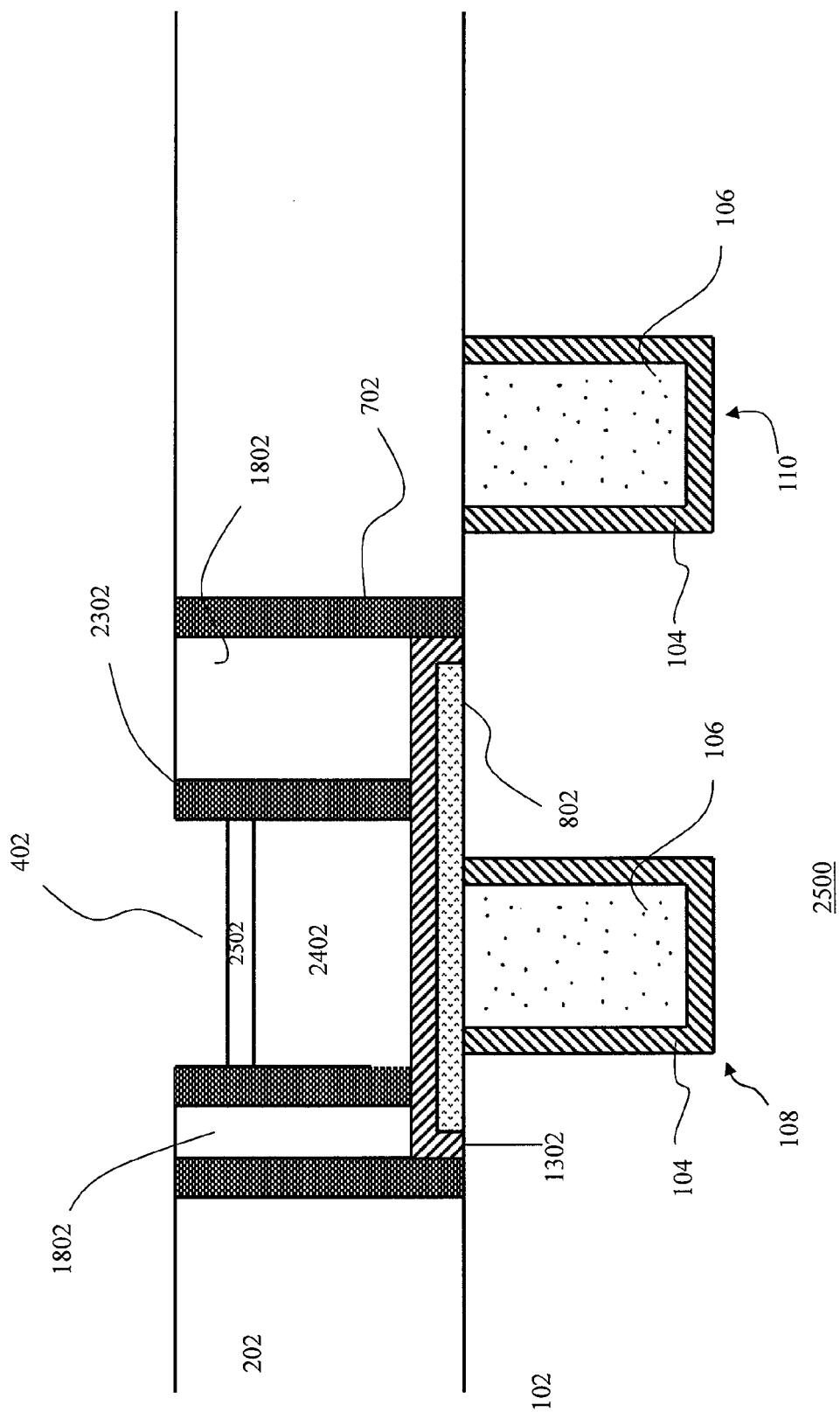
FIG. 25 is a follow-on view of the F-RAM PZT electrode structure.

With reference additionally now to FIG. 25, the addition of a top electrode to the F-RAM PZT structure 2400 is shown, creating an F-RAM PZT electrode structure 2500. In FIG. 25, a top electrode, TE 2502 material is deposited, planarized and etched back into the F-RAM opening 402. The etching is performed with a reactive-ion agent and the TE 2502 material lies on top of the PZT 2402 layer. Suitable materials for the TE 2502 include iridium (Ir) and iridium oxide (IrOx), platinum (Pt), palladium (Pd) and palladium oxide (PdOx), ruthenium (Ru) and ruthenium oxide (RuOx), rhodium (Rh) and rhodium oxide (RhOx), and other compatible noble metals.

Figure 26:
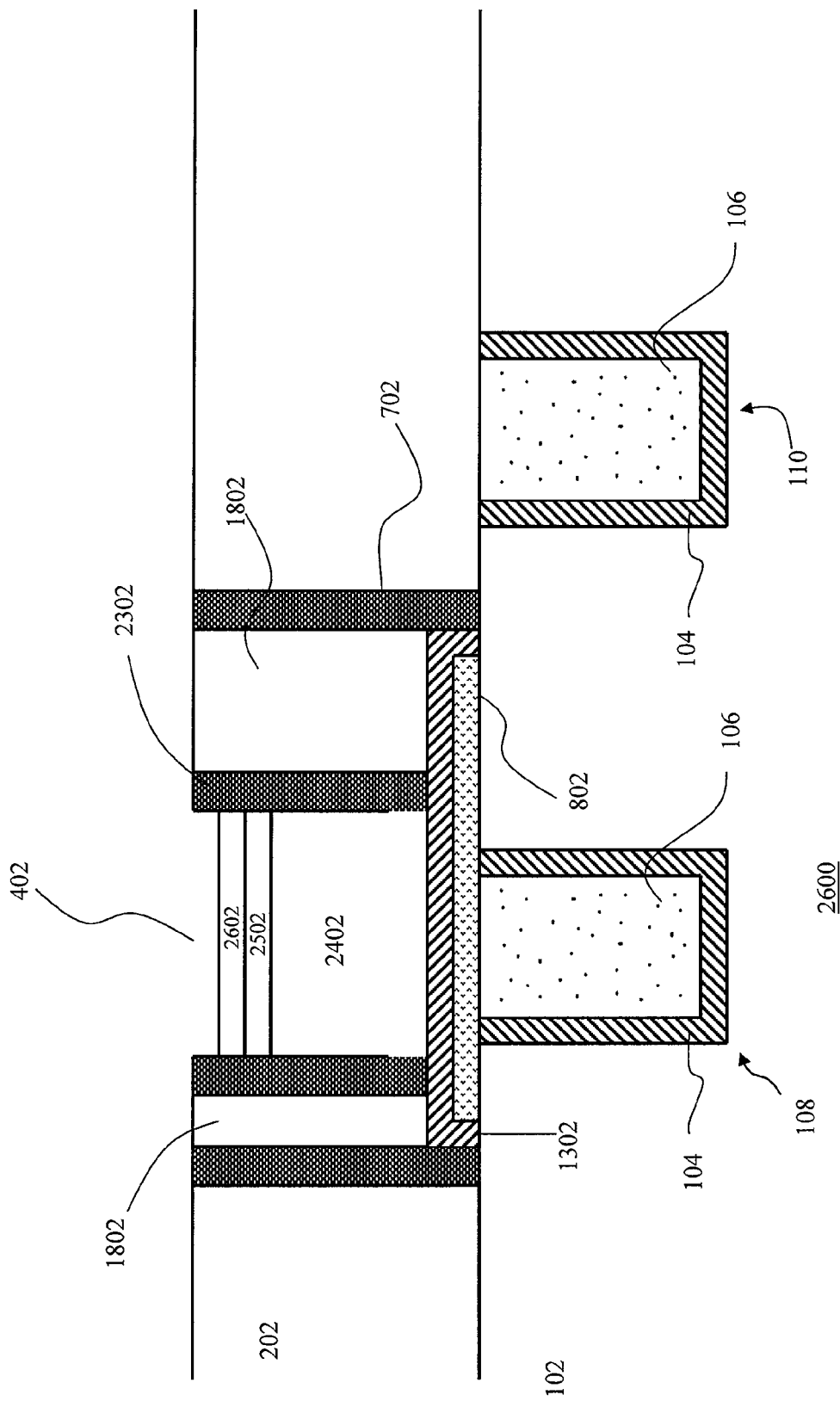
FIG. 26 is a follow-on view of the F-RAM PZT Ti/TiN structure.

With reference additionally now to FIG. 26, the addition of a layer of Ti/TiN to the F-RAM PZT electrode structure 2500 is illustrated, creating an F-RAM PZT Ti/TiN structure 2600. In FIG. 26, a layer of titanium/titanium nitride Ti/TiN 2602 is deposited onto the F-RAM PZT electrode structure 2500. The Ti/TiN 2602 is planarized to the surface of the F-RAM opening 402 and then etched with a reactive-ion reagent back in the F-RAM opening 402. In this step the Ti/TiN 2602 layer overlies the top of the TE 2502 layer.

Figure 27:
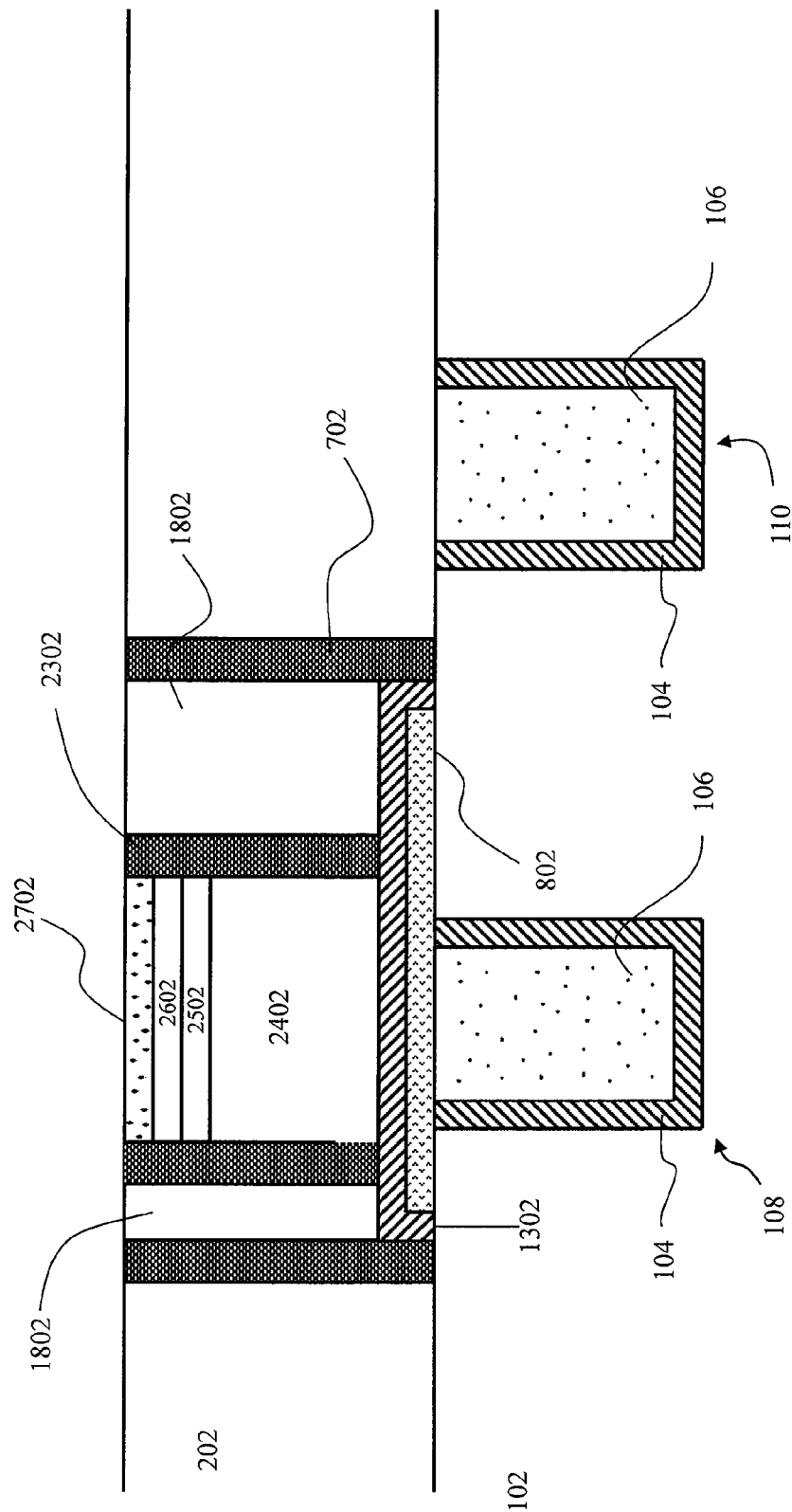
FIG. 27 is a follow-on view of the F-RAM PZT nitride structure.

With reference additionally now to FIG. 27, the addition of a nitride layer is shown, forming F-RAM PZT nitride structure 2700. In FIG. 27, a nitride 2702 layer is subsequently deposited and planarized on top of the Ti/TiN 2602 layer in the F-RAM PZT Ti/TiN structure 2600. Note that in this step, the nitride 2702 layer remains planar with the top surface of the thick oxide 202.

Figure 28:
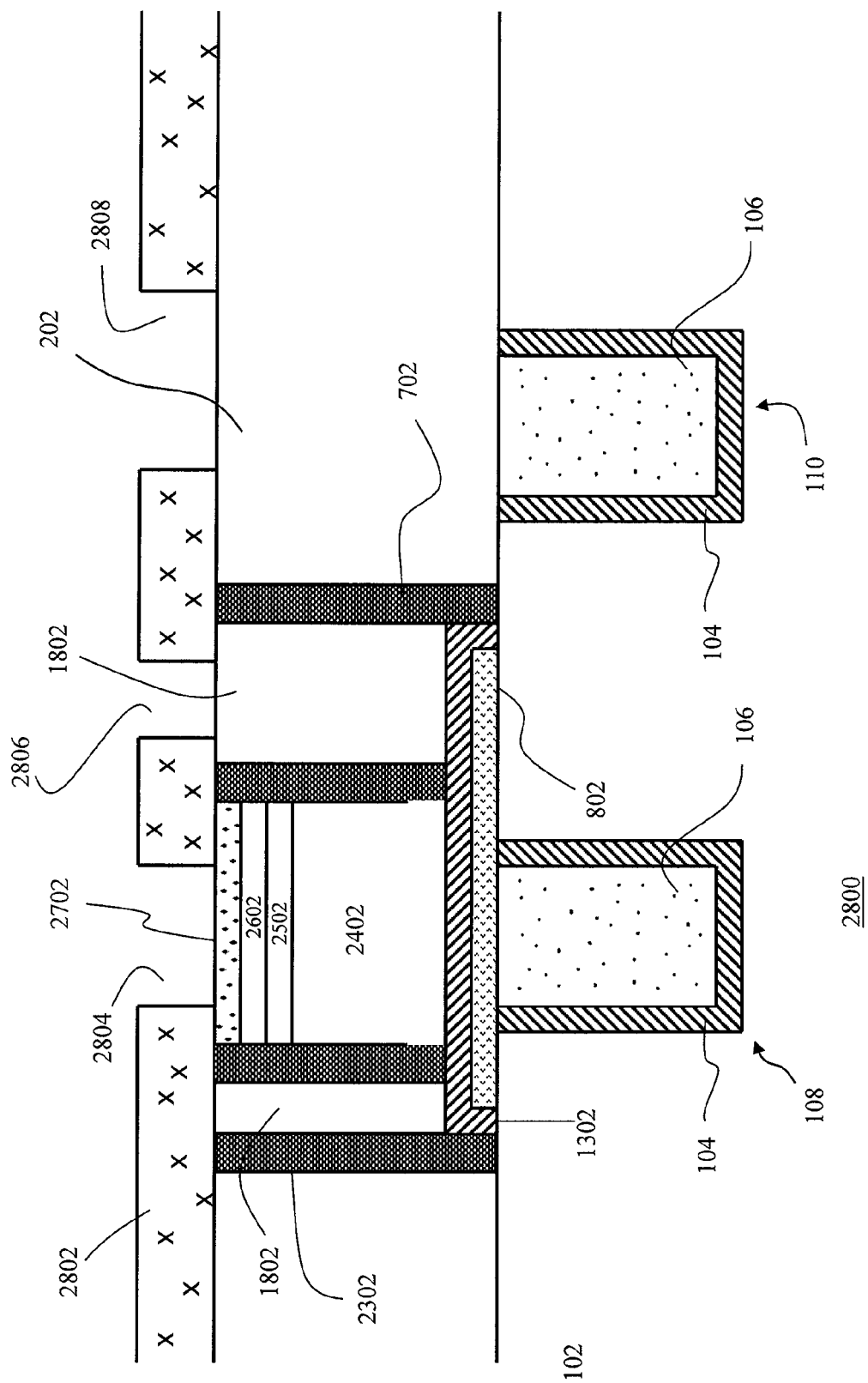
FIG. 28 is a follow-on view of the contact photoresist mask structure.

With reference additionally now to FIG. 28, the application of a photoresist mask on top of the F-RAM PZT nitride structure 2700 is depicted, creating a contact photoresist mask structure 2800. In FIG. 28, a photoresist mask 2802 (similar to the step in FIG. 20) is imaged and developed on top of the F-RAM PZT nitride structure 2700 to form mask openings over three different regions: the opening 1 2804 over the nitride 2702, the opening 2 2806 over the etched oxide 1802, and the opening 3 2808 over the thick oxide 202.

Figure 29:
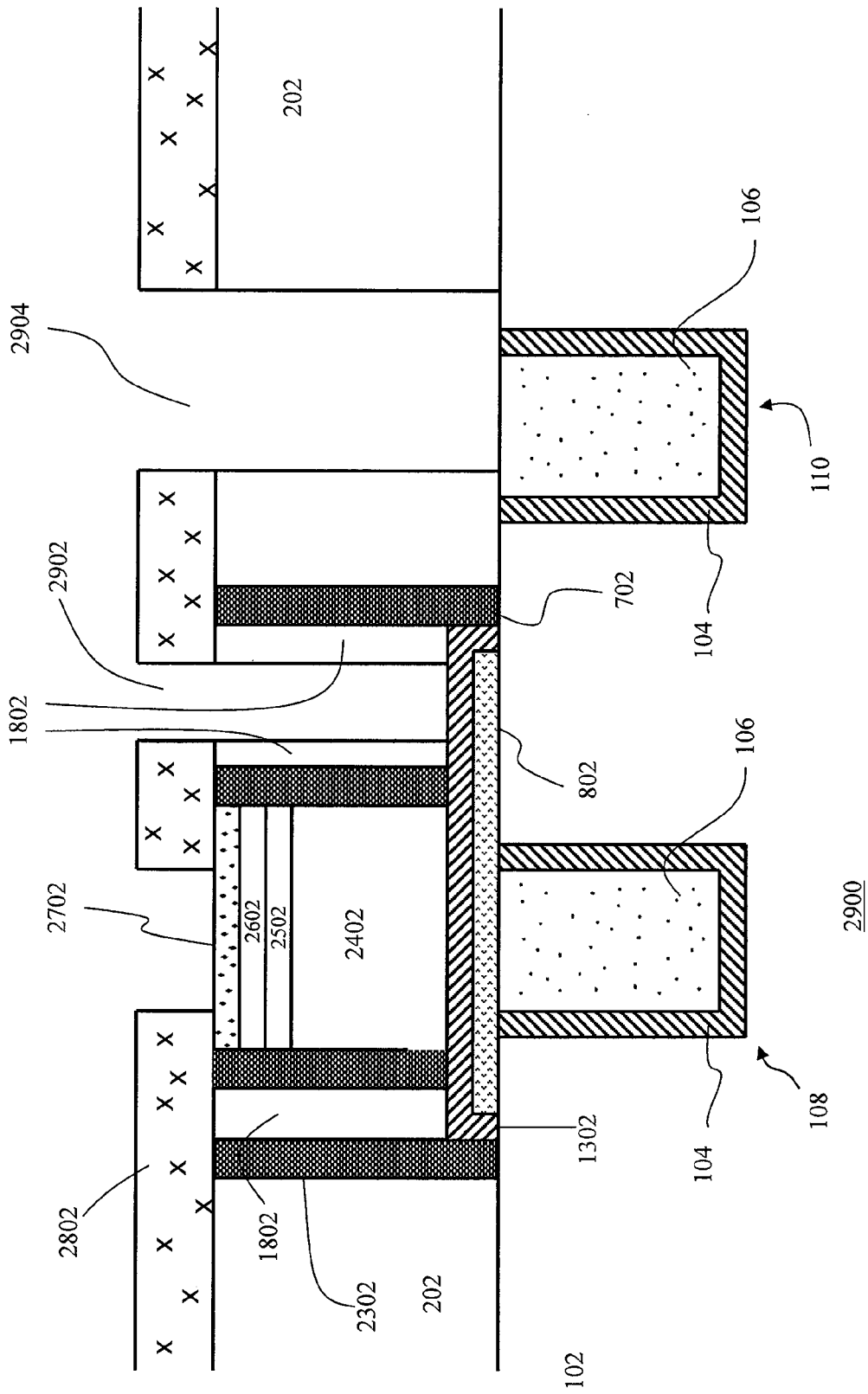
FIG. 29 is a follow-on view of the contact oxide etching structure.

With reference additionally now to FIG. 29, the etching of the exposed oxide in the contact photoresist mask structure 2800 is shown, creating contact oxide etching structure 2900. Continuing with the process, in FIG. 29, the exposed oxide 1802 layer and the exposed thick oxide 202 are etched away using $CF_4$ in oxygen, forming opening 2902 and opening 2904 conforming to the pattern of the photoresist mask 2802. Note that in this process step, opening 1 2804 over the nitride 2702 is left undisturbed.

Figure 30:
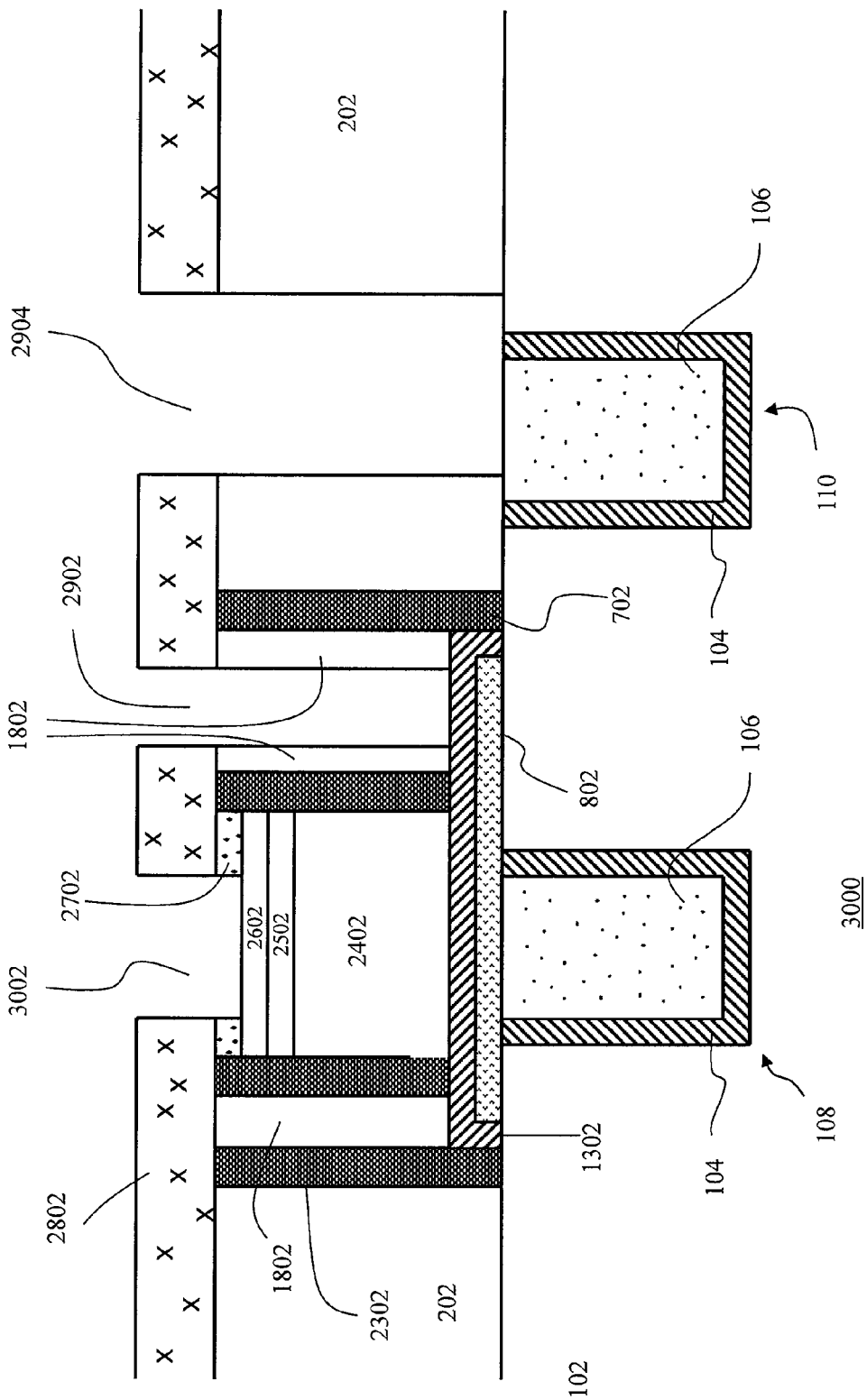
FIG. 30 is a follow-on view of the contact nitride etching structure.

With reference additionally now to FIG. 30, an additional etching in the contact oxide etching structure 2900 is shown, forming contact nitride etching structure 3000. In FIG. 30, a gas etch chemistry ($CF_4$ with 4% oxygen) is employed to etch the exposed area of the silicon nitride 2702 layer back to the Ti/TiN 2606 layer. This etching agent acts without affecting the thick oxide 202, oxide 1802, or the Ti/TiN 2602 layer below the silicon nitride 2702. This process step forms the opening 3002.

Figure 31:
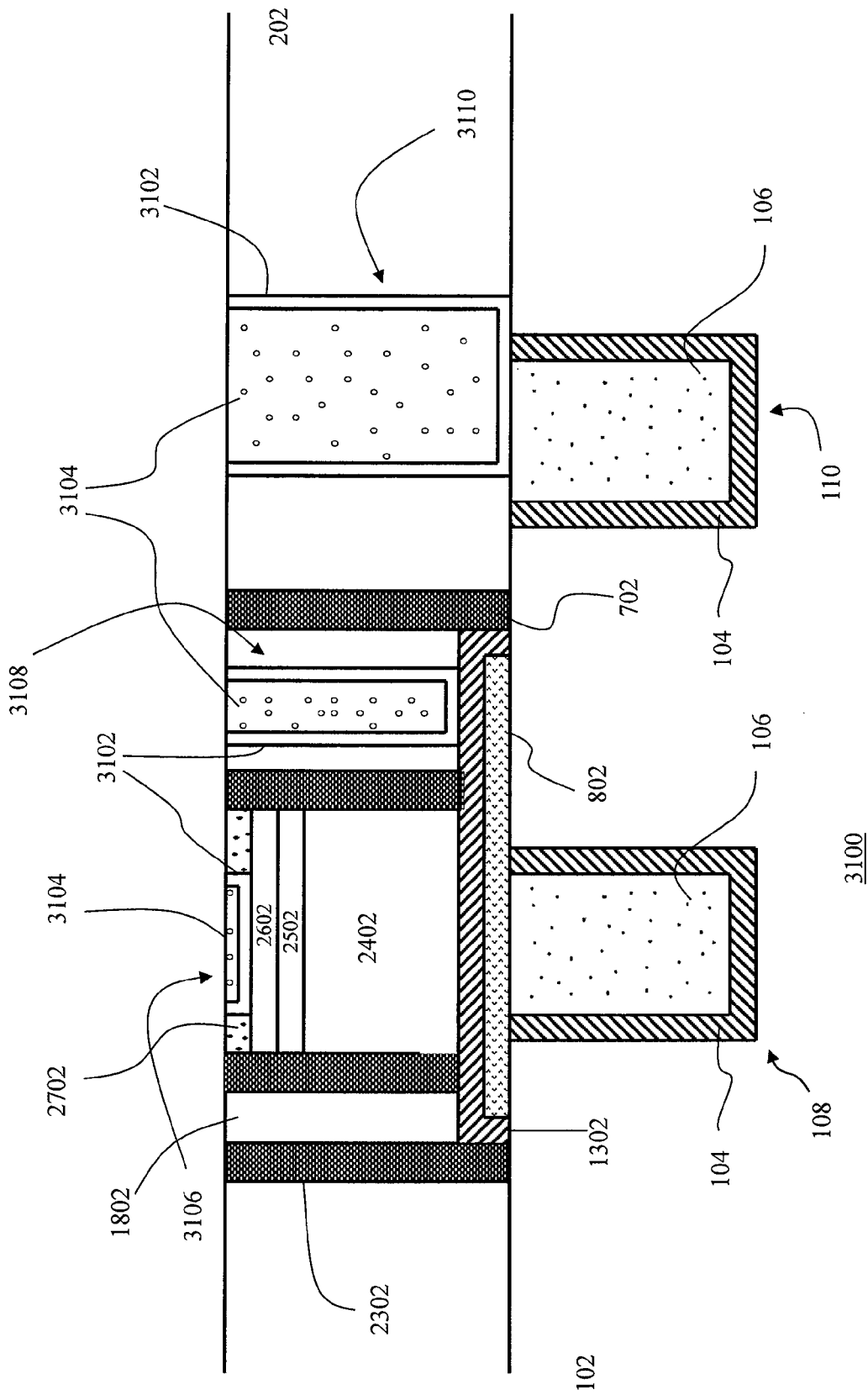
FIG. 31 is a follow-on view of the F-RAM contact stud structure.

With reference additionally now to FIG. 31, the removal of the photoresist mask and the addition of three contact studs to the contact nitride etching structure 3000 is shown, creating the final F-RAM contact stud structure 3100.

The last process steps are illustrated in FIG. 31. The photoresist mask 2802 is removed from the F-RAM contact stud structure 3100 using the same $O_2$ plasma ash etching technique as used earlier. Subsequently Ti/TiN liners 3102 are deposited onto opening 2902, opening 2904, and opening 3002 followed by an application of a CVD tungsten 3104 layer over the entire surface of the F-RAM contact stud structure 3100, followed by a CMP process to polish back and planarize the CVD tungsten 3104 back to the level of the thick oxide 202. As a result of these steps, three new contact studs (contact stud 3106, contact stud 3108 and contact stud 3110) are formed of Ti/TiN and CVD tungsten. Contact stud 3106 contacts the Ti/TiN 2602 layer and consequently the TE 2502 layer. Contact stud 3108 contacts the base of the platinum 1302 which is on the other side of the F-RAM structure and between the $Al_2O_3$ spacers 2302 and 702 as illustrated.

As can be appreciated by reference to the drawing figures, there are provided alternative contacts to the bottom electrode (platinum 1302 layer) of the ferroelectric capacitor in the form of contact stud 108 and contact stud 3108. Although both are herein illustrated and described, either may be utilized alone or in combination. It should be noted that omitting contact stud 3108 will provide greater device density in an integrated circuit embodiment of the present invention.

While there have been described above the principles of the present invention in conjunction with specific processing steps and device structure, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A method for forming an integrated circuit device on a substrate comprising:
    forming a first insulating layer on said substrate;
    removing a portion of said first insulating layer to produce an opening to an exposed surface of said substrate therein;
    forming first spacers on sidewalls of said opening;
    forming a first conductive layer on said exposed surface of said substrate separated from said first spacers on said sidewalls of said opening by a gap therebetween;
    forming a bottom electrode of a ferroelectric capacitor over said first conductive layer and in said gap laterally of said first conductive layer;
    forming a second insulating layer adjoining said spacers in said opening;
    forming second spacers on said second insulating layer in said opening;
    forming a ferroelectric dielectric on said bottom electrode between said second spacers;
    forming a top electrode on said ferroelectric dielectric;
    forming a bottom electrode contact opening through a portion of said second insulating layer to said bottom electrode;
    and forming a first electrical contact to said top electrode and a second electrical contact to said bottom electrode through said bottom electrode contact opening.

2. The method of claim 1 further comprising:
    providing at least one contact stud in said substrate extending to said exposed surface of said substrate in said opening.

3. The method of claim 1 wherein said step of forming first spacers on said sidewalls of said opening comprises:
    depositing a first spacer material over said first insulating layer; and
    removing said first spacer material except on said sidewalls of said opening.

4. The method of claim 3 wherein said first spacer material comprises $Al_2O_3$.

5. The method of claim 3 wherein said step of depositing is carried out by chemical vapor deposition.

6. The method of claim 1 wherein said step of forming said first conductive layer comprises:
    depositing a first conductive layer material over said first insulating layer and said first spacers; and
    removing said first conductive layer material except on said exposed surface of said substrate separated from said first spacers by said gap.

7. The method of claim 6 wherein said first conductive layer material comprises $Ti_{1-x}Al_xN$.

8. The method of claim 6 wherein said step of depositing is carried out by chemical vapor deposition.

9. The method of claim 1 wherein said step of forming said bottom electrode comprises:
    depositing a bottom electrode material over said first insulating layer, said first spacers and in said gap laterally of said first conductive layer in said opening; and
    removing said bottom electrode material except over said bottom electrode and within said gap.

10. The method of claim 9 wherein said bottom electrode material comprises Pt.

11. The method of claim 9 wherein said step of depositing comprises chemical vapor deposition.

12. The method of claim 1 wherein said step of forming said second insulating layer comprises:
    depositing an oxide over said first insulating layer, said first spacers and said bottom electrode;
    and removing said oxide except adjoining said first spacers.

13. The method of claim 1 wherein said step of forming said second spacers comprises:
    depositing a second spacer material over said first and second insulating layers and said bottom electrode; and
    removing said second spacer material except adjoining said second insulting layer in said opening.

14. The method of claim 13 wherein said second spacer material comprises $Al_2O_3$.

15. The method of claim 13 wherein said step of depositing comprises chemical vapor deposition.

16. The method of claim 1 wherein said step of forming said ferroelectric dielectric comprises:
    depositing said ferroelectric dielectric material over said bottom electrode; and
    annealing said ferroelectric dielectric material.

17. The method of claim 16 wherein said step of depositing is carried out by deposition of one of PZT, PLZT, BST, SBT, STO or other ferroelectric dielectric materials.

18. The method of claim 1 wherein said step of forming said top electrode comprises:
    depositing a top electrode material over said ferroelectric dielectric.

19. The method of claim 18 wherein said top electrode material comprises one of Ir, IrOx, Pt, Pd, PdOx, Ru, RuOx, Rh, RhOx, or other compatible noble metals.

20. The method of claim 1 further comprising:
forming a contact layer material over said top electrode.

21. The method of claim 20 wherein said step of forming said contact layer material is carried out by the deposition of Ti/TiN.

22. The method of claim 1 wherein said step of forming a bottom electrode contact opening comprises:
anisotropically etching said portion of said second insulating layer to said bottom electrode.

23. The method of claim 1 wherein said step of forming said first and second electrical contacts comprises:
depositing a conductive layer material over said top electrode and said bottom electrode in said bottom electrode contact opening.

24. The method of claim 23 wherein said step of depositing comprises the steps of:
firstly depositing a first contact material over said top electrode and said bottom electrode adjoining sidewalls of said bottom electrode contact opening; and
secondly depositing said conductive layer material over said first contact material.

25. The method of claim 24 wherein said first contact material comprises Ti/TiN and said conductive layer material comprises W.

26. The method of claim 24 wherein said conductive layer material is deposited by chemical vapor deposition.

27. A method for forming a ferroelectric device on a planar surface of a semiconductor substrate comprising:
forming a relatively thick oxide layer on said planar surface;
selectively etching an opening through said oxide layer in a pattern established by a non-erodible mask;
applying and selectively etching a first aluminum oxide conformal layer to form first spacers on sidewalls of said opening;
depositing a titanium aluminum nitride layer in a lower portion of said opening and separated from said first spacers;
forming a bottom electrode of a ferroelectric capacitor over said first aluminum oxide conformal layer and in contact with said spacers laterally of said first aluminum oxide conformal layer;
depositing, planarizing and selectively removing an oxide material to form an additional oxide layer adjoining said first spacers in said opening;
depositing and selectively etching a second aluminum oxide layer to form second spacers on said additional oxide layer;
depositing and etching a ferroelectric layer on said bottom electrode between said second spacers;
forming a top electrode on said ferroelectric layer;
forming a Ti/TiN and W contact to said bottom electrode through said oxide material; and
also substantially concurrently forming a Ti/TiN and W contact to said top electrode.

28. The method of claim 27 wherein said non-erodible mask comprises photoresist.

29. The method of claim 27 wherein said step of applying and selectively etching said first aluminum oxide conformal layer comprises:
chemical vapor deposition of aluminum oxide over said relatively thick oxide layer and within said opening; and removal of said aluminum oxide from said relatively thick oxide layer and the planar surface of said substrate leaving said first spacers.

30. The method of claim 29 wherein said step of removal of said aluminum oxide comprises a directional reactive ion etch process.

31. The method of claim 27 wherein said step of depositing a titanium aluminum nitride layer comprises:
chemical vapor deposition of titanium aluminum nitride over said relatively thick oxide layer and within said opening; and
removal of said titanium aluminum nitride from said relatively thick oxide layer and said first spacers.

32. The method of claim 31 wherein said step of removal of said titanium aluminum nitride comprises a wet etch process.

33. The method of claim 27 wherein said step of forming a bottom electrode comprises:
depositing a noble metal over said relatively thick oxide layer, said first spacers and said titanium aluminum nitride layer; and
removing said noble metal from said relatively thick oxide layer and said first spacers except for over said titanium aluminum nitride layer and laterally thereof in contact with said first spacers.

34. The method of claim 33 wherein said noble metal comprises one of Ir, IrOx, Pt, Pd, PdOx, Ru, RuOx, Rh, or RhOx.

35. The method of claim 33 wherein said step of removing comprises a wet etch process.

36. The method of claim 27 wherein said step of depositing, planarizing and selectively removing an oxide material comprises:
depositing said oxide material over said relatively thick oxide layer, said first spacers and said bottom electrode in said opening;
chemical mechanical polishing of said oxide material to a level of said first spacers; and
removing said oxide material within said opening to a level of said bottom electrode except adjoining said first spacers to form said additional oxide layer adjoining said first spacers.

37. The method of claim 27 wherein said step of depositing and selectively etching a second aluminum oxide layer comprises:
chemical vapor deposition of aluminum oxide over said relatively thick oxide layer, said additional oxide layer adjoining said first spacers and said bottom electrode; and
removal of said aluminum oxide from said relatively thick oxide layer and upper portions of said additional oxide material and said bottom electrode to form said second spacers medially displaced from said first spacers.

38. The method of claim 37 wherein said step of removal of said aluminum oxide comprises a directional reactive ion etch process.

39. The method of claim 27 wherein said step of depositing and etching a ferroelectric layer comprises:
depositing a ferroelectric material on said bottom electrode between said second spacers; and
removing a portion of said ferroelectric material to a level below distal ends of said second spacers.

40. The method of claim 39 wherein said ferroelectric material comprises one of PZT, PLZT, BST, SBT, STO or other ferroelectric dielectric materials.

41. The method of claim 27 wherein said step of forming a top electrode comprises:
depositing a noble metal over said ferroelectric layer; and etching said noble metal to a level below distal ends of said second spacers.

42. The method of claim 41 wherein said noble metal comprise one of Ir, IrOx, Pt, Pd, PdOx, Ru, RuOx, Rh, or RhOx.

43. The method of claim 41 further comprising:
also depositing a Ti/TIN layer over said noble metal; and
etching said Ti/TiN layer to a level below distal ends of said second spacers.

44. The method of claim 27 wherein said step of forming a Ti/TiN and W contact comprises:
depositing a nitride layer over said top electrode;
planarizing said nitride layer to a level of said relatively thick oxide layer;
etching through a portion of said additional oxide layer to form a bottom electrode contact opening; and
etching through said nitride layer to form a top electrode contact opening.

45. The method of claim 42 wherein said steps of forming said contact to said bottom electrode and forming said contact to said top electrode comprise:
depositing Ti/TiN liners in said bottom electrode contact opening and said top electrode contact opening;
and chemical vapor depositing W in said Ti/TiN liners.

46. The method of claim 27 further comprising:
planarizing said contacts to said bottom and top electrodes to a level of said relatively thick oxide layer.

47. The method of claim 46 wherein said step of planarizing comprises a chemical mechanical polishing process.

48. A method for forming an integrated circuit device on a substrate including at least one contact stud, said method comprising:
forming a first insulating layer on said substrate;
removing a portion of said first insulating layer to produce an opening to an exposed surface of said substrate therein;
forming first spacers on sidewalls of said opening;
forming a first conductive layer in contact with said at least one contact stud on said exposed surface of said substrate separated from said first spacers on said sidewalls of said opening by a gap therebetween;
forming a bottom electrode of a ferroelectric capacitor over said first conductive layer and in said gap laterally of said first conductive layer;
forming a second insulating layer adjoining said spacers in said opening;
forming second spacers on said second insulating layer in said opening;
forming a ferroelectric dielectric on said bottom electrode between said second spacers;
forming a top electrode on said ferroelectric dielectric; and
forming an electrical contact to said top electrode.

49. The method of claim 48 wherein said step of forming first spacers on said sidewalls of said opening comprises:
depositing a first spacer material over said first insulating layer; and
removing said first spacer material except on said sidewalls of said opening.

50. The method of claim 49 wherein said first spacer material comprises $Al_2O_3$.

51. The method of claim 49 wherein said step of depositing is carried out by chemical vapor deposition.

52. The method of claim 48 wherein said step of forming said first conductive layer comprises:
depositing a first conductive layer material over said first insulating layer and said first spacers in contact with said at least one contact stud; and
removing said first conductive layer material except on said exposed surface of said substrate separated from said first spacers by said gap.

53. The method of claim 52 wherein said first conductive layer material comprises titanium aluminum nitride.

54. The method of claim 52 wherein said step of depositing is carried out by chemical vapor deposition.

55. The method of claim 48 wherein said step of forming said bottom electrode comprises:
depositing a bottom electrode material over said first insulating layer, said first spacers and in said gap laterally of said first conductive layer in said opening; and
removing said bottom electrode material except over said bottom electrode and within said gap.

56. The method of claim 55 wherein said bottom electrode material comprises Pt.

57. The method of claim 55 wherein said step of depositing comprises chemical vapor deposition.

58. The method of claim 48 wherein said step of forming said second insulating layer comprises:
depositing an oxide over said first insulating layer, said first spacers and said bottom electrode;
and removing said oxide except adjoining said first spacers.

59. The method of claim 48 wherein said step of forming said second spacers comprises:
depositing a second spacer material over said first and second insulating layers and said bottom electrode;
and removing said second spacer material except adjoining said second insulting layer in said opening.

60. The method of claim 59 wherein said second spacer material comprises $Al_2O_3$.

61. The method of claim 59 wherein said step of depositing comprises chemical vapor deposition.

62. The method of claim 48 wherein said step of forming said ferroelectric dielectric comprises:
depositing said ferroelectric dielectric material over said bottom electrode; and
annealing said ferroelectric dielectric material.

63. The method of claim 62 wherein said step of depositing is carried out by deposition of one of PZT, PLZT, BST, SBT, STO or other ferroelectric dielectric materials.

64. The method of claim 48 wherein said step of forming said top electrode comprises:
depositing a top electrode material over said ferroelectric dielectric.

65. The method of claim 64 wherein said top electrode material comprises one of Ir, IrOx, Pt, Pd, PdOx, Ru, RuOx, Rh, RhOx, or other compatible noble metals.

66. The method of claim 48 further comprising:
forming a contact layer material over said top electrode.

67. The method of claim 66 wherein said step of forming said contact layer material is carried out by the deposition of Ti/TiN.

68. The method of claim 48 wherein said step of forming said electrical contact comprises:
depositing a conductive layer material over said top electrode.

69. The method of claim 68 wherein said step of depositing comprises the steps of:
firstly depositing a first contact material over said top electrode; and
secondly depositing said conductive layer material over said first contact material.

70. The method of claim 69 wherein said first contact material comprises Ti/TiN and said conductive layer material comprises W.

71. The method of claim 69 wherein said conductive layer material is deposited by chemical vapor deposition.

\* \* \* \* \*